(12) United States Patent
Castleman et al.

(10) Patent No.: US 11,644,678 B1
(45) Date of Patent: May 9, 2023

(54) BAROMETRIC PRESSURE SENSOR ARRAYS FOR DETECTING PRESENCE AND MOTION OF OBJECTS FOR TRACKING OR TRIGGERING A RESPONSE

(71) Applicant: Sony Interactive Entertainment Inc., Tokyo (JP)

(72) Inventors: Dennis Castleman, San Mateo, CA (US); Todd Tokubo, San Mateo, CA (US); Victoria Dorn, San Mateo, CA (US)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 17/522,710

(22) Filed: Nov. 9, 2021

(51) Int. Cl.
*G02B 27/01* (2006.01)
*G01L 19/14* (2006.01)
*B81B 7/02* (2006.01)

(52) U.S. Cl.
CPC ............ *G02B 27/0176* (2013.01); *B81B 7/02* (2013.01); *G01L 19/14* (2013.01); *B81B 2201/0264* (2013.01); *G02B 2027/0178* (2013.01)

(58) Field of Classification Search
CPC ........ G02B 27/0176; G02B 2027/0178; B81B 7/02; B81B 2201/0264; G01L 19/14
See application file for complete search history.

(56) References Cited

U.S. PATENT DOCUMENTS

| | | | |
|---|---|---|---|
| 10,564,717 B1 | 2/2020 | Shahmohammadi et al. | |
| 11,143,865 B1* | 10/2021 | Bedard | G02B 25/001 |
| 2015/0062321 A1* | 3/2015 | Mankowski | G01S 7/539 |
| | | | 348/78 |
| 2015/0193785 A1 | 7/2015 | Besehanic et al. | |
| 2017/0293356 A1 | 10/2017 | Khaderi et al. | |
| 2017/0367651 A1 | 12/2017 | Tzvieli et al. | |
| 2018/0286070 A1 | 10/2018 | Benedetto | |
| 2019/0029528 A1 | 1/2019 | Tzvieli et al. | |
| 2021/0096637 A1 | 4/2021 | Wang | |
| 2022/0139188 A1* | 5/2022 | Peyrard | A61B 5/6803 |
| | | | 340/573.7 |

FOREIGN PATENT DOCUMENTS

EP        3 252 566 A1    12/2017

OTHER PUBLICATIONS

ISR PCT/US2022/048102, dated Feb. 6, 2023, 8 pages.

* cited by examiner

*Primary Examiner* — Sahlu Okebato
(74) *Attorney, Agent, or Firm* — Penilla IP, APC

(57) ABSTRACT

Methods and systems for interacting with an augmented reality application includes a providing an array of barometric pressure sensors within a housing of a wearable device to capture pressure variances detected from motion of one or more facial features that are proximate to the array of barometric pressure sensors. The pressure variances are analyzed to identify motion metrics related to the motion of the facial features. The motion metrics are used to derive engagement metrics of the user to content of the augmented reality application presented to the user.

19 Claims, 7 Drawing Sheets

BAROMETRIC PRESSURE SENSOR ARRAYS FOR DETECTING PRESENCE AND MOTION OF OBJECTS FOR TRACKING OR TRIGGERING A RESPONSE

TECHNICAL FIELD

The present disclosure relates to tracking motion of objects using pressure sensors and analyzing pressure waves created by the motion to trigger response to interactive applications.

BACKGROUND OF THE DISCLOSURE

Video games and interactive applications have grown in popularity and have become mainstream. With the growing number of interactive applications (e.g., video games, social media applications, and other virtual/augmented reality/mixed interactive applications), it will be useful to the developers of these interactive applications to gauge user interest or lack thereof for the content of different applications being presented to the users. Gauging interest level of the users to the content of the different applications will assist the developers and content providers to provide content that is useful and/or interesting to the user. Providing useful or interesting content increases user engagement in the content.

Improving user engagement may also result in increased content sharing. When more and more users share the content provided by a content provider, for example, the popularity of the content increases, which can lead to higher revenue (e.g., in the form of advertisement revenue) for the developer or content provider (e.g., application developer, content distributor, etc.).

It is in this context that embodiments of the disclosure arise.

SUMMARY

Embodiments of the present disclosure relate to systems and methods for providing a set of barometric pressure sensors on a device used for presenting content of an interactive application to a user. The device may be a head mounted display (HMD) worn on a head of a user or may be a pair of glasses worn by a user or may be an interfacing device (e.g., a controller) that is used by the user for providing input to an interactive application, such as a video game application or augmented reality (AR) application. An array of barometric pressure sensors may be integrated into a housing of the device interfacing with the video game or AR application. The array of barometric pressure sensors may be arranged along a single line, or along a surface of the device. The barometric pressure sensors, in one implementation, may be directionally mounted along an inside surface of the frame of the pair of glasses or the HMD used for the AR application so as to face the facial feature whose motion is being tracked. The barometric pressure sensors are configured to sense the motion occurring in the tracked facial feature that is proximate to the array of pressure sensors. The motion is configured to produce a pressure wave that lasts for a short duration of time, and the array of sensors are tuned to detect the pressure wave from the motion.

In some implementations, the array of sensors are directionally mounted on the inside surface of the frames of the HMD or the glasses so as to be located proximal to and directed toward the eyes of the user (i.e., the facial feature whose motion is being tracked). The proximal disposition of the sensors to the eyes of the user allows the sensors to detect and monitor pressure waves resulting from motion of the eyes of the user. For instance, the barometric pressure sensors are tuned to detect pressure variances occurring due to the user blinking their eyes, or moving their eyes in different directions in order to view different portions of the content rendered on the display of the HMD or the glasses. Alternately, the barometric pressure sensors may be directed toward the nose of the user to capture breathing patterns of the user, or toward the mouth of the user to capture the movement of the mouth when the user is speaking or breathing through their mouth. The pressure changes are of short duration and the barometric pressure sensors are tuned to be sensitive enough to detect and capture the changes in the pressure. In the case where the motion of the eyes of the user is being monitored, the captured pressure changes are interpreted to determine metrics of the motion of the eyes of the user. In addition to interpreting the motion of the eyes of the user, where the motions of the nose and the mouth of user are monitored, the motions related to the nose and the mouth may also be interpreted to determine additional metrics. In some implementation, machine learning may be engaged to interpret the captured pressure changes to determine the metrics of the motion of different parts of the user's face. The metrics are used to define engagement metrics (i.e., a level of engagement) of the user toward the content that is being presented on the display. In addition to defining engagement metrics of the user toward the content that is being presented, the metrics may also be used to provide inputs to the interactive application, or to trigger a response from the interactive application, or to provide additional content or alternate content to the user, or to provide information related to an activity that is being performed by the user. The engagement metrics of the user may be updated to a user profile of the user so that additional or alternate content can be identified and presented to the user based on the engagement metrics of the user to the content being presented. Other advantages will become apparent to one skilled in the art after reviewing the various implementations.

In one implementation, a device for interacting with an augmented reality application is disclosed. The device includes housing, an array of barometric pressure sensors and a processor. The array of barometric pressure sensors is disposed on a surface of the housing and is configured to detect variance in pressure caused by a motion occurring proximate to the array. The processor is configured to interpret the variances in the pressure detected by the array to determine metrics of motion occurring proximate to the array and to derive engagement metrics of the user to the content of the augmented reality application presented to the user.

In one implementation, the processor is configured to interpret the metrics of motion generated during rendering of different portions of the content of the augmented reality application and to derive and associate engagement metrics of the user to corresponding one of the different portions of content of the augmented reality application, or to trigger a response from the augmented reality application for specific one or more of the different portions based on the engagement metrics of the user, or provide an input to one or more of the different portions of the augmented reality application based on the metrics of motion.

In one implementation, the device is a head mounted display or a pair of glasses worn by the user and includes a display screen for rendering the content of the augmented reality application. The housing is a frame of the head mounted display or the pair of glasses. The surface of the housing on which the array of barometric pressure sensors is disposed is an inside surface of the frame of the head mounted display or the pair of glasses. The barometric pressure sensors are disposed on the inside surface along a top portion of the frame and directionally mounted to face toward the eyes of the user.

In one implementation, the array of barometric pressure sensors is directionally mounted such that the barometric pressure sensors of the array are separated from the eyes of the user by a distance. The distance and the directional mount on the inner side of the top portion of the frame are defined to detect pressure waves generated from motions of the eyes of the user. The processor is configured to interpret the pressure waves to determine the metrics of the motions.

In one implementation, the barometric pressure sensors of the array are arranged in a single line along the top portion of the inside surface of the frame of the head mounted display or the pair of glasses.

In one implementation, the metrics of motion determined from the variances in the pressure detected by the array include one or more of a rate of blinking, blinking pattern, speed of movement, direction of movement, specific time points when the motion occurred, content being presented at the specific time points, and time point when the eyes of the user returned to normal restful position.

In one implementation, the housing is a frame of a head mounted display or a pair of glasses worn by the user, the housing includes a display screen for rendering content of the augmented reality application. The surface of the housing on which the array of barometric pressure sensors is disposed is an outside surface of the frame of the head mounted display or the pair of glasses. The barometric pressure sensors are disposed on the outside surface along a bottom portion of the frame and directionally mounted to face down toward nose of the user.

In one implementation, the array of barometric pressure sensors is directionally mounted such that the barometric pressure sensors of the array are separated from the nose of the user by a second distance. The second distance and the directional mount on the outside surface along the bottom portion of the frame are defined to enable detection of pressure waves generated by breathing of the user. The processor is configured to interpret the pressure waves to determine the metrics related to breathing of the user. The augmented reality application in this implementation is a fitness tracker application.

In one implementation, the device is a controller used to interact with the content of the augmented reality application rendered on a display screen associated with the device. The array of barometric pressure sensors is directionally mounted to an outside surface of the device and configured to detect variances in pressure occurring from the motion of a hand of the user proximate to the array. The motion is interpreted to provide input to the augmented reality application.

In one implementation, the device is a wearable fitness tracker.

In one implementation, the device is communicatively coupled to a local console or to a cloud server executing the augmented reality application and providing the content for rendering on a display screen associated with the device.

In one implementation, the device includes additional sensors to capture movement, orientation, direction, and speed of movement of the device. The metrics of motion of the user captured by the array of barometric pressure sensors are fused with information of motion of the device captured by the additional sensors and used to determine engagement metrics of the user to content of the augmented reality environment.

In one implementation, a method for interacting with an augmented reality application is disclosed. The method includes detecting motion associated with a part of a user's face, the motion being detected using a array of barometric pressure sensors that are disposed on a surface of a wearable device worn by the user. The motion is analyzed to determine metrics related to the motion occurring proximate to the array of barometric pressure sensors. The metrics of motion are interpreted to determine engagement metrics of the user to the content being present at a display screen of the wearable device.

The array of barometric pressure sensors are used to capture data related to motion associated with one or more facial features of the user (e.g., movement of a user's eyes or the nose or the mouth) or hands of the user while the user, wearing the device, is viewing the content being presented on a display screen of the device. The data related to the motion of the user captured by the pressure sensors may be in addition to data captured by other sensors (e.g., inertial measurement unit (IMU) sensors) available at the wearable device, wherein the IMU sensors (e.g., accelerometer, magnetometer, gyroscopes, etc.,) capture data (i.e., six-axis data) that can be used to determine movement, orientation, direction, speed of movement, etc., of the device within a physical space. The data related to the motion detected by the barometric pressure sensors can be used to provide additional input to the interactive application, provide alternate ways to trigger response from the interactive application, provide additional content or alternate content, modify content currently rendering, etc., during current session or during subsequent sessions.

For example, when the barometric pressure sensors are integrated into a fitness tracker application, the additional data provided by the barometric pressure sensors can be independently used or merged/fused with data provided by other sensors (e.g., IMU data from IMU sensors) that are also integrated into the fitness tracker to provide information related to the physical state of the user. The barometric pressure sensors may be directionally mounted to monitor user's breathing, for example, and to identify the breathing pattern based on the pressure waves generated due to breathing. The breathing pattern can be used to determine the user's physiological state (e.g., panting may be due to the user being in an excited state, deep breathing or slow breathing may be correlated to relaxed state, etc.) while viewing or interacting with content rendering on the display screen of the device, such as head mounted display (HMD), pair of eyeglasses, etc., or on a second screen (i.e., display) that is external of the HMD or the pair of eyeglasses.

Similarly, the barometric pressure sensors may be directionally mounted to monitor motion of the eyes of the user, which can then be used to determine the metrics of motion, such as direction of movement of the eyes, the blinking pattern, the content that is being rendered in the portion that correlates with the direction of movement, amount of time taken to return the user's eyes to the normal position, etc. The metrics of motion are then used to determine the engagement metrics of the user to the content being presented (e.g., whether the user is interested (i.e., engaged with) or not interested in the content, etc. Based on the engagement metrics, the interactive application can continue to provide more of the content of the interactive application or modify the content or provide different content or pause the content to allow the user to recover or re-focus. Thus, the barometric pressure sensors can be used to track motions of a user's eyes, mouth, nose, hands when content of the interactive application is being presented to the user, and combine the motion related data with IMU sensor data capturing movement of the device on which the IMU sensors are mounted to provide a more comprehensive feedback to the user.

Other aspects and advantages of the disclosure will become apparent from the following detailed description, taken in conjunction with the accompanying drawings, illustrating by way of example the principles of the disclosure.

BRIEF DESCRIPTION OF THE DRAWINGS

The disclosure may best be understood by reference to the following description taken in conjunction with the accompanying drawings.

FIGS. 2A-1, 2A-2 illustrate a simplified block diagram of a head mounted display on which the barometric pressure sensors are mounted to capture the pressure variations, in one implementation of the present disclosure.

FIGS. 5A-5C illustrate examples of pressure waves created by movement of eyes, eyelashes of a user when blinking, wherein the pressure waves are detected by sensors mounted on an inside surface of a frame of the wearable device, in accordance to one implementation of the present disclosure.

DETAILED DESCRIPTION

Figure 1:
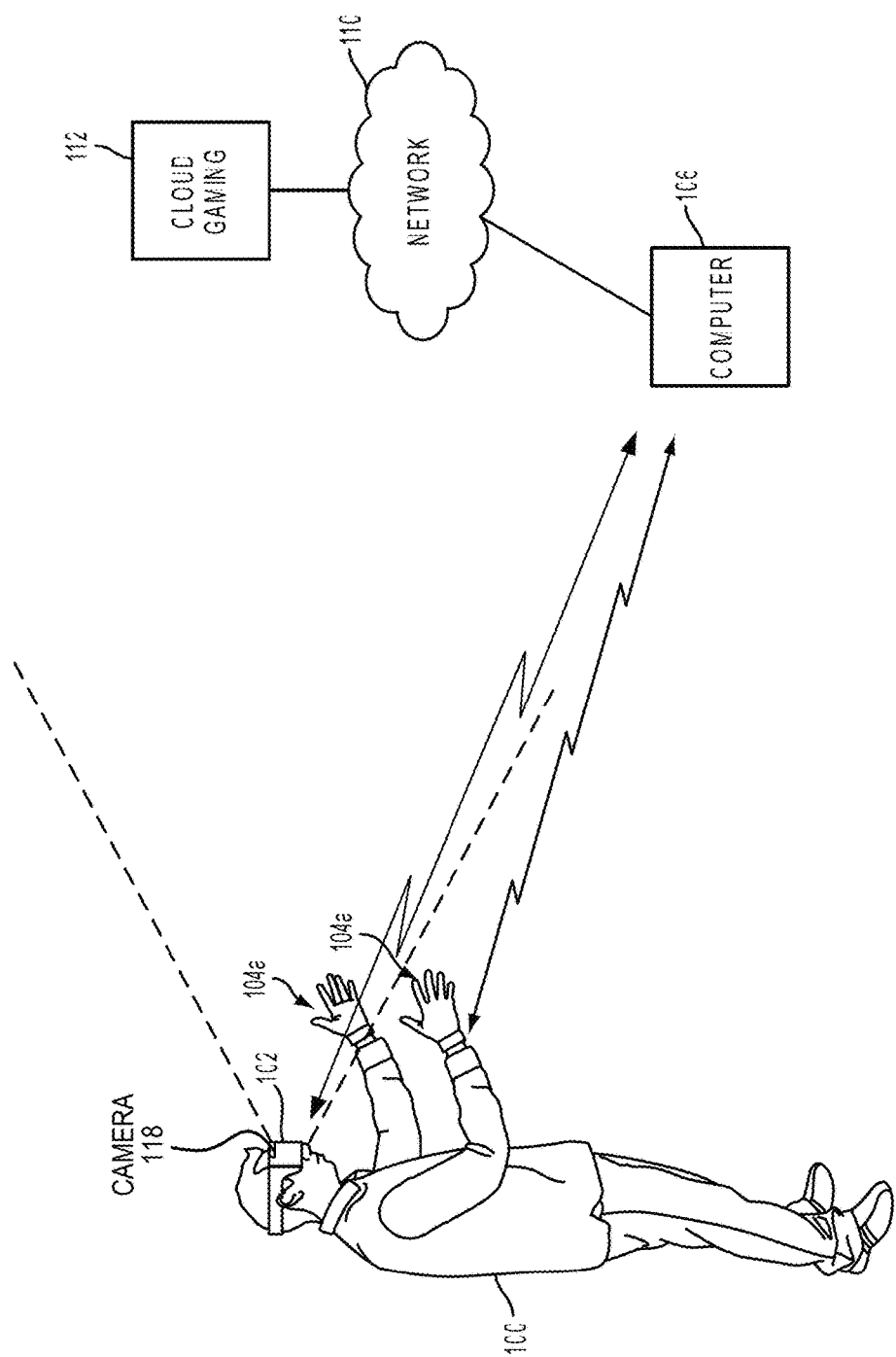
FIG. 1 illustrates a simplified block diagram of a system used for deriving engagement metrics of users watching media content, in accordance with one implementation of the present disclosure.

In the following description, numerous specific details are set forth in order to provide a thorough understanding of the present disclosure. It will be apparent, however, to one skilled in the art that the present disclosure may be practiced without some or all of these specific details. In other instances, well known process steps have not been described in detail in order not to obscure the present disclosure.

As more and more media content is being made available online, users are able to access the various media content and fully immerse in viewing and interacting with these media content. The media content available to the user include streaming media content of live event, such as a live game, live gameplay of a video game, live concert, live debate, etc., provided by media content provider or a user, or streaming pre-recorded media content (e.g., TV shows, movies, lectures, public or private events, video games, etc.,) provided by content provider or a user, or content from an augmented reality application. The media content (or simply referred to hereonwards as "content") may be rendered on a display screen associated with a computing device or a television, or a wearable device, such as a head mounted display (HMD) or a pair of eyeglasses. The content may be provided by a console available locally to the wearable device or may be provided by a server that is connected to the wearable device through a network, such as Internet. Users may interact with the media content and such interactions may be used to adjust the content, provide additional content, adjust the state of the content, etc.

User inputs may be captured through user inputs provided using buttons, joysticks, interactive pad, etc., available on a hand-held controller or using other input devices (e.g., keyboards, mouse, etc.,), or through inputs provided using sensors embedded in the controllers or wearable devices, or through user interfaces that may be provided alongside the content. The sensors (IMU sensors—such as gyroscopes, accelerometers, magnetometers, GPS sensors, image sensors, etc.) that are available in the controllers or wearable device are used to obtain data related to the movement, orientation, direction, speed of movement of the device or controller in relation to other objects in the physical environment. In addition to the IMU sensors, the wearable devices and/or the controllers may be equipped with an array of barometric pressure sensors that are configured to detect pressure waves caused by motion of one or more facial features of a user wearing the wearable device. The barometric pressure sensors are disposed on the wearable device (e.g., head mounted display or pair of eyeglasses) so as to be proximate to one or more of facial features of the user in order to detect and capture data related to motion of the respective one or more facial features. For example, the pressure sensors may be disposed proximate to and directionally oriented toward the eyes of the user and tuned to detect pressure waves caused by the movement of the eyes of the user as the user watches different portions of content rendered on the wearable device, such as the HMD, for example.

The pressure waves are analyzed to determine metrics of motion, which can be used to provide inputs to an interactive application that is providing content for the user, adjust the content being rendered, provide additional content, trigger response from the interactive application, etc. The data related to the motion of the facial features of the user may be provided as separate inputs to the interactive application, or maybe fused with the inputs provided via the IMU sensors, inputs provided through controllers or interactive interface, etc., to fine tune the user interactions. The data provided by the pressure sensors, for example, may be used to determine engagement metrics of the user to the content, provide input to the interactive application, trigger response from the interactive application, adjust content (e.g., audio or video content) presented to the user, etc.

The pressure waves caused by the motion of the facial features (e.g., eyes, nose, mouth) may be present for a short duration. As a result, the pressure sensors are selected to be sensitive enough to detect and capture the pressure waves caused by such motion. The captured pressure waves can be analyzed to define metrics of the motion, which can be used to derive additional metrics related to the user's reaction to the content so that appropriate content may be presented to the user.

With the general understanding of the invention, specific implementations will be described with reference to the various figures.

FIG. 1 illustrates a simplified block diagram of an example system in which a wearable device with the pressure sensors may be used to determine engagement metrics of the user watching content of an augmented reality (AR) application, in one implementation. The system of FIG. 1 is shown to be used by the user for interacting with a video game application. It should be noted that the system is not restricted to the use of interacting with the video game application but can also be extended to the user interacting with any augmented reality application or other types of interactive application. A user 100 is shown wearing a wearable device (e.g., head mounted display (HMD)) 102. The HMD 102 is worn in a manner similar to glasses, goggles, or a helmet, and is configured to render content from the video game or other interactive application on a display screen associated with the HMD 102 for the user 100 to view. In an alternate implementation, in place of the HMD 102, the user may be wearing a pair of smart eyeglasses with a display screen for rendering content of an augmented reality application, or a pair of eyeglasses with associated external display screen for rendering the content of the augmented reality or other interactive application. The external display screen is communicatively connected to the pair of eyeglasses. Referring to the implementation where the user is wearing the HMD 102, the HMD 102 provides a very immersive experience to the user by virtue of its provision of display mechanisms in close proximity to the user's eyes. The HMD 102 can provide display regions to each of the user's eyes which occupy large portions or even the entirety of the field of view of the user. Optics provided in the HMD 102 enable the user to view the content rendered in close proximity to the user's eyes. The optics takes into consideration the visual characteristics of the user when presenting the content to the user. It should be noted herein that throughout this application various implementations have been described with reference to a display screen of the HMD 102 or the pair of eyeglasses being used to render content from augmented reality (AR) applications. However, the implementations are not restricted to rendering content of AR applications but can also be extended to render content from virtual reality (VR) applications or mixed reality applications as well.

In one embodiment, the HMD 102 maybe communicatively connected to a computer 106. The computer 106 may be local or remote to the HMD 102. As a result, the connection to computer 106 may be wired or wireless. In the implementation illustrated in FIG. 1, the HMD 102 is connected to the computer 106 through wireless connection. The computer 106 can be any general or special purpose computer known in the art, including but not limited to, a gaming console, personal computer, laptop, tablet computer, mobile device, cellular phone, tablet, thin client, part of a set-top box, media streaming device, virtual computer, remote server computer, etc. With regards to remote server computer, the server computer may be a cloud server within a data center of an application cloud system. The data center includes a plurality of servers that provide the necessary resources to host one or more interactive application that provide the necessary content to the HMD 102 for rendering. The interactive application may be a distributed application that can be instantiated on one or more cloud servers within one data center or distributed across multiple data centers, and when instantiated on a plurality of cloud servers, the data of the interactive application is synchronized across the plurality of cloud servers. In one embodiment, the interactive application may be an augmented reality (AR) application or a video game application, and the computer 106 is configured to execute an instance of the AR application or the video game application, and output the video and audio data from the AR application or the video game application for rendering on a display screen associated with the HMD 102. In another implementation, the server may be a stand-alone server that is capable of executing an instance of the interactive application, or may be a server that is configured to manage one or more virtual machines that is capable of executing an instance of the interactive application (e.g., AR application or video game application) and provide the content for rendering, in real-time or delayed time.

Alternately, the server may include a plurality of consoles and an instance of the video game may be accessed from one or more consoles (e.g., game consoles). The consoles may be independent consoles or may be rack-mounted server or a blade server. The blade server, in turn, may include a plurality of server blades with each blade having required circuitry and resources for instantiating a single instance of the video game application, for example, to generate the gameplay data stream. Other types of cloud servers, including other forms of blade server may also be engaged for executing an instance of the interactive application (e.g., video game application) that generates the content of the interactive application (e.g., gameplay data stream).

The user 100 may operate a glove interface object 104a or a controller (not shown) or other input devices or input interfaces associated with the HMD to provide input for the video game. In some implementations, the inputs may be provided through one or more buttons or via an interactive interface disposed on the outside surface of the HMD. Additionally, an image capturing device, such as a camera 118 disposed on an outside surface of the HMD 102, for example, is configured to capture images of the interactive environment in which the user 100 is located. These captured images can be analyzed to determine the location and movements of the user 100, of the HMD 102, of the glove interface object 104a or of the controller. In one embodiment, the glove interface object 104a or the controller includes a light or other visual indicators which can be tracked to determine their respective location and orientation.

The controller can be a single-handed controller or a two-handed controller. As noted, the controllers can be tracked by tracking lights associated with the controllers, or tracking shapes, and tracking inertial data provided by sensors associated with the controllers. Using these various types of controllers, or even simply hand gestures that are made and captured by one or more cameras, it is possible to interface, control, maneuver, interact with, and participate in the virtual reality environment presented on the HMD 102.

Additionally, the HMD 102 may include one or more lights which can be tracked to determine the location and orientation of the HMD 102. The camera 118 can include one or more microphones to capture sound from the interactive environment. Sound captured by a microphone array may be processed to identify the location of a sound source. Sound from an identified location can be selectively utilized or processed to the exclusion of other sounds not from the identified location. Furthermore, the camera 118 can be defined to include multiple image capturing devices (e.g. stereoscopic pair of cameras), an IR camera, a depth camera, or any two or more combinations thereof.

In another embodiment, the computer 106 functions as a thin client in communication over a network with a server computing device of a cloud gaming site 112 executing the video game, or the interactive application or an augmented reality application. In the case of the interactive application being a video game application selected for game play by the user 100, the cloud gaming site 112 maintains and executes the video game on the computer 106 or on a server within a cloud gaming site 112. In the case where the video game is executed on the cloud gaming site 112, the computer 106 transmits inputs from the HMD 102, the glove interface object 104a and the camera 118, to the server on the cloud gaming site 112, which processes the inputs to affect the game state of the executing video game. The output from the executing video game, such as video data, audio data, and haptic feedback data, is transmitted by the server of the cloud gaming site 112 to the computer 106. The computer 106 may further process the data received from the cloud gaming server before transmission or may directly transmit the data to the relevant devices for rendering. For example, video and audio data streams may be provided to the HMD 102, whereas haptic feedback data is provided to the glove interface object 104a or the controller.

In one embodiment, the HMD 102, glove interface object 104a, and camera 118, may themselves be networked devices that independently and directly connect to the network 110 to communicate with the server at the cloud gaming site 112. For example, the computer 106 may be a local network device, such as a router, that does not otherwise perform video game processing, but which facilitates passage of network traffic. The connections to the network 110 by the HMD 102, glove interface object 104a, and camera 118 may be wired or wireless.

Additionally, the various implementations of the present disclosure are described with reference to a head mounted display but can be extended to other wearable devices or interactive devices, including without limitation, pair of eyeglasses, mobile devices (e.g., smart phones, tablet computing devices, etc.), or handheld devices (e.g., single-handed controller, double-handed controller, etc.). In the various implementations, the screen on which the content of the interactive application is being rendered for the user wearing the HMD to view may be a display screen of the HMD or an external display screen that is communicatively connected to the HMD 102. The external display screen may be a LCD display screen, a display screen associated with a portable computing device, such as a screen of a tablet computing device, screen of a mobile phone, etc., to which the HMD 102 is communicatively connected, or an external surface on which the content can be projected.

In one implementation, the HMD 102 includes an array of barometric pressure sensors arranged on a surface of the HMD 102 and directionally oriented toward a facial feature of the user wearing the HMD. The barometric pressure sensors are in addition to other sensors that are available with the HMD 102. Some of the other sensors, such as accelerometers, magnetometers, gyroscopes, image sensors, etc., are used to track the location, orientation, direction, movement, speed of movement of the HMD 102 in the physical environment and therefore of the user wearing the HMD 102. The barometric pressure sensors are used to track motion from the corresponding facial feature as the user responds to or interacts with the content presented on the display screen associated with the HMD 102. The facial feature may include the eyes, the nose, or the mouth/chin, for example.

In one implementation, the array of barometric pressure sensors is arranged on an inside surface of a frame of the HMD 102 proximate to the lens of the HMD 102 and directionally oriented to face the eyes of the user so that pressure waves caused by the motion of the eyes of the user can be easily detected. The motion of the eyes may be in response to the content being rendered on the HMD 102 or may be in response to events occurring in the physical environment in the vicinity of the user while the user is viewing or interacting with the content. In one implementation, the array of barometric pressure sensors may be aligned in a single line along an inside surface of the frame of the HMD 102 and be positioned just above and proximate to the lens of the HMD 102. In alternate implementation, the array of barometric pressure sensors may be aligned along the inside surface of the frame and around the lens of the HMD 102. The location of the barometric pressure sensors are not limited to the aforementioned location and that other locations on the inside surface of the frame of the HMD 102 for the barometric pressure sensors may also be envisioned. The barometric pressure sensors of the array may be ultra-sensitive pressure sensors, in that they are capable of detecting the pressure waves generated from the movement of the eyes of the user or other facial features that is proximate to the array. The proximity, in one implementation, is defined by a separation distance between the array and the facial feature whose movement is being tracked, so that the pressure sensors are able to detect pressure waves generated by the movement of the facial feature of the user, for example. In some implementations, the sensitivity of the pressure sensors may be tuned to detect changes in pressure waves caused by the blinking or other movement of the eyes of the user.

The pressure waves caused by the motions of the eyes of the user, for example when the facial feature being tracked is the eyes, while the user is reacting to the content that is being rendered on a display screen of the HMD, are analyzed to determine metrics of the motion. The motions of the eyes that may cause the pressure waves include blinking, moving in one or more directions (e.g., up, down, side-to-side, etc.). These motions last for a short period of time. Consequently, the pressure sensors are tuned to detect and capture the short lived pressure waves caused by these motions. The metrics that can be identified by analyzing the pressure waves include normal blinking pattern, change in the normal blinking pattern, amount of time the change in the blinking pattern lasts, speed of blinking, normal position, direction of movement of the eyes of the user, speed of movement, amount of displacement from the normal position to a new position, amount of time the user's eyes are in the new position, time point when the user's eyes return to normal position, etc.

Alternately, the array of barometric pressure sensors may be located on an outside surface of the frame of the HMD 102 so as to be proximal to the nose of the user. In this case the barometric pressure sensors are disposed to monitor the actions of the user's nose. The pressure sensors may be used to capture the pressure waves resulting from the user's breathing. The captured pressure waves may be used to determine the various metrics corresponding to the user's breathing, such as normal breathing pattern, changes to the normal breathing pattern, time point when the breathing changes from the normal breathing pattern, time point when the breathing returns to normal state, type of breathing (e.g., regular breathing, deep breathing, intermittent breathing, etc.), etc.

In another alternate implementation, the barometric pressure sensors are disposed on the outside surface of the frame of the HMD 102 proximal to the mouth of the user so as to be able to detect and monitor motion of the user's mouth. In this case, the pressure sensors may be used to capture the pressure waves caused by the user speaking or vocalizing. The captured pressure waves are then evaluated to determine the various metrics of motion of the mouth, such as normal position of the mouth, direction of movement of the different parts of the mouth, speed of speech (may be used to represent the user's excited state, for example), amount of time the user continues at the speed, time when the user's vocalizing returns to normal state, etc. The metrics from the motion of the mouth of the user may be used to determine the excitement level of the user while watching content, etc. The excitement level can be used to gauge the engagement metrics of the user to the content as a whole and to different portions of the content.

The metrics identified from the motion of some of the facial features that were tracked using the barometric pressure sensors are used to define additional metrics, such as engagement metrics, physiological state of the user, expressions of the user, etc. In one implementation, the metrics and the additional metrics obtained by analyzing data captured from the pressure sensors may then be used by the processor to provide appropriate content to the user or provide input to the interactive application, or trigger a response from the interactive application.

In an alternate implementation, the metrics obtained from the data captured by the pressure sensors are used to fine tune the metrics determined from data captured by the other sensors, such as accelerometers, gyroscopes, magnetometers, image sensors, etc., available within the HMD 102. In another implementation, the metrics from the data captured by the pressure sensors may be fused (i.e., integrated) with the metrics from the data obtained from other sensors. The fused data is used to derive additional metrics associated with the interactions of the user. The metrics and additional metrics may then be used by the processor to determine the type of content that is to be provided to the user—i.e., whether to continue providing content of the interactive application, or adjust the content, or provide new content, or recommend additional content for subsequent sessions of the user. In addition to or instead of the type of content to provide to the user, the metrics and additional metrics may be used as input to trigger response from the interactive application, provide inputs to adjust a state of the interactive application (e.g., update a game state in a video game application), etc. The metrics and additional metrics, for instance, may indicate that the user is continually getting distracted (moves the eyes constantly from one direction to another, or may not follow the content) or is not currently engaged with the content. In such cases, the processor may detect the lack of engagement or increased distraction of the user and determine a length of time of such lack of engagement or distraction. When the length of time exceeds a predefined threshold, the interactive application may trigger a signal to pause the content currently being provided to the HMD 102 for rendering, or switch to different content, or provide additional content, or provide options to the user to select a different interactive application or different content. The triggering of the signal or provisioning of alternate content may be to improve the engagement metrics of the user or to allow the user to interact in a safe manner.

Figure 2B:
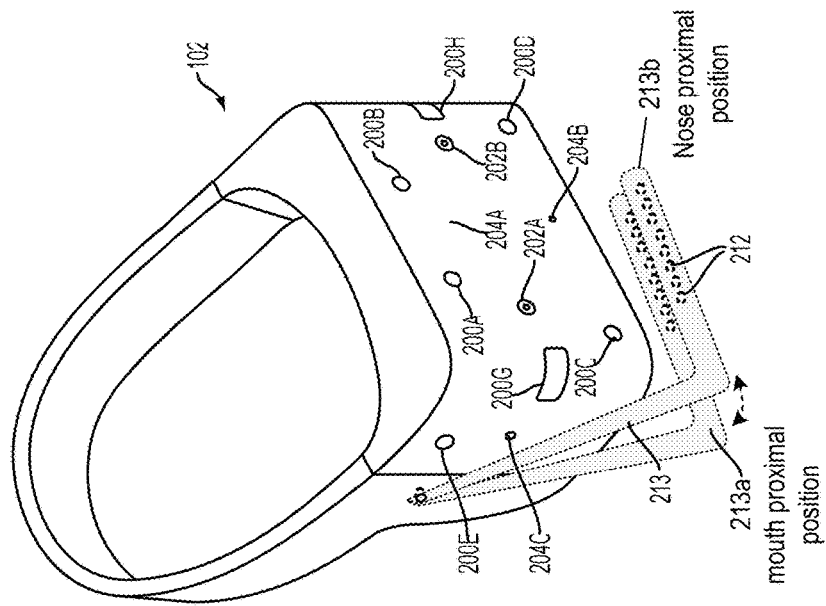
FIG. 2B illustrates a simplified block diagram of a head mounted display on which the barometric pressure sensors are mounted, in accordance with an alternate implementation of the disclosure.
Figures 1, 2A:
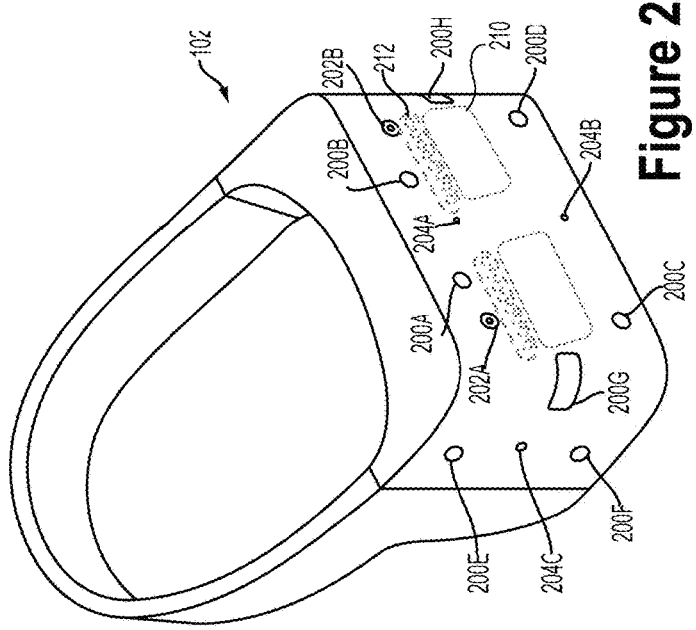
Figures 2, 2A:
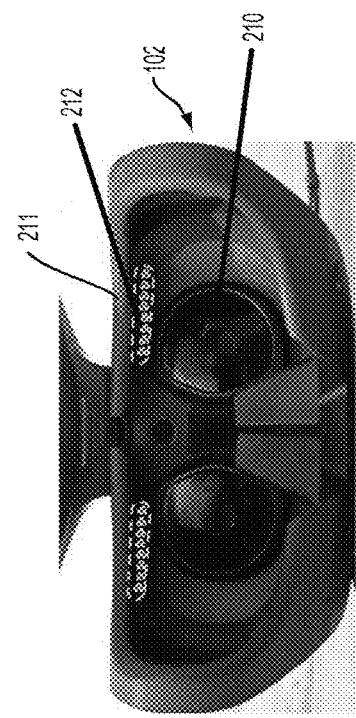

FIGS. 2A-1, 2A-2 and 2B illustrate simplified block diagrams of a HMD 102 with the barometric pressure sensors disposed on a surface of the HMD 102. The barometric pressure sensors 212 may be disposed on a surface of the HMD 102 or alternately may be disposed external to the HMD 102 but be part of the HMD 102. In the case of the barometric pressure sensors 212 being disposed on the surface of the HMD 102, the barometric pressure sensors may be disposed on an inside surface (in the case where the motion of the eyes of the user has to be monitored) or an outside surface (in the case where the motion of the nose or mouth of user has to be monitored) of the HMD 102. FIGS. 2A-1 and 2A-2 shows one example implementation of the HMD 102 with the array of barometric pressure sensors 212 disposed along an inside surface of the frame of the HMD 102 to monitor the motion of the eyes of the user. FIG. 2A-1 illustrates a view of the external side of the HMD 102 and FIG. 2A-2 illustrates a view of the internal side of the HMD102 identifying a location on the frame 211 of the HMD 102 where the barometric pressure sensors 212 are disposed. FIG. 2B illustrates an alternate implementation where the barometric pressure sensors are disposed on the surface of an adjustable handle that is attached to the HMD 102' and disposed on the outside surface of the frame. The HMD 102, 102' may or may not be configured to have see-through capability.

In one implementation illustrated in FIGS. 2A-1, 2A-2, the HMD 102 includes a pair of lens 210 (i.e., part of the optics), with each lens of the pair being oriented in front of each eye of the user, when the user is wearing the HMD 102. In an alternate implementation, the lens may be provided in front of one eye of the user, instead of both the eyes of the user. The HMD 102 illustrated in FIGS. 2A-1, 2A-2 is configured to render augmented reality environment, wherein the display screen provides a see-through capability into the real-world in the vicinity of the user. The lens 210 is configured to allow the user to view the real-world objects as well as the virtual elements that are overlaid over some of the real-world objects. For instance, the pair of lens 210 may be configured to adjust the image of the virtual elements and the view of the real-world objects in accordance to vision characteristics of the user.

Referring to FIGS. 2A-1, 2A-2, an array of barometric pressure sensors 212 are disposed on the inside surface of a frame 211 of a housing of the HMD 102, wherein the inside surface of the frame 211 is defined above the lens 210. The housing includes additional components of the HMD 102, such as the Inertial Measure Unit (IMU) sensors, plurality of lights, microphones, image capture devices that are used in the functioning of the HMD 102, memory and a processor that is communicatively connected to barometric pressure sensors 212 and the additional components (i.e., IMU sensors, lights, microphones, image capture devices, etc.).

Details of the additional components included in the housing of the HMD 102 will be discussed in detail with reference to FIG. 6. The HMD includes communication capabilities to access the network using wired, wireless, or 3G/4G/5G communication, etc. The HMD 102 may run an operating system and include network interfaces. In one implementation, the processor of the HMD 102 may also be communicatively connected to a controller (not shown), a glove interface object (104a of FIG. 1), one or more cameras (118 of FIG. 1), a computer (106 of FIG. 1) or stand-alone console, a router, to name a few. The glove interface object (104a of FIG. 1) is used to provide inputs to an interactive application providing content for the user to view on the display screen of the HMD 102 (or 102'). The external camera is used to capture images of the user wearing the HMD and forward it to the HMD or to the computer for processing. In some implementations, the processor of the HMD may process some of the data provided by the various components, including the barometric pressure sensors, and forward the processed data to the computer for further processing. The computer may be used to process the data provided by the HMD 102 and provide updated content of the interactive application to the HMD for rendering to the user. Alternatively, the computer may forward the processed data provided by the HMD 102 to a cloud computing server for further processing. The computer may forward the processed data from the HMD 102 to the interactive application executing on the cloud computing server via a router and receive the content from the interactive application, which is then forwarded to the HMD 102 for rendering. Alternatively, the HMD 102 may forward the processed data directly to the interactive application executing on the cloud computing server (i.e., remote server) via the router and, in return, receive content of the interactive application provided by the cloud computing server. When the HMD 102 directly communicates with the cloud computing device through the router, the HMD 102 will be a networked computing device.

The lights 200A-200H included in the HMD 102 are disposed on an outside surface of the frame of the HMD 102 and are used to track the HMD 102. The light 200A-200H may be configured to have specific shapes, and have the same or different colors. The lights 200A, 200B, 200C, and 200D are arranged on the outside surface on the front side of the HMD 102. The lights 200E and 200F are arranged on a side surface of the HMD 102 and the lights 200G and 200H are arranged at corners of the HMD 102. The lights 200A-200H are disposed to span the front surface and a side surface of the HMD 102. Images of the lights 200A-200H may be captured by an image capturing device (e.g., camera 118 of FIG. 1) and used to identify a location and an orientation of the HMD 102 in the physical environment where the user wearing the HMD 102 is present. It should be noted that some of the lights 200A-200H may or may not be visible depending upon the particular orientation of the HMD 102 relative to the image capture device. Also, different portions of lights (e.g. lights 200G and 200H) may be exposed for image capture depending upon the orientation of the HMD 102 relative to the image capture device.

In some implementations, the lights 200 can be configured to indicate a current status of the HMD to others in the vicinity. For example, some or all of the lights may be configured to have a certain color arrangement, intensity settings, be configured to blink, have a certain on/off configuration, or other arrangement indicating a current status of the HMD 102. By way of example, the lights can be configured to display different configurations during active gameplay of a video game (i.e., during an active timeline or during a time the user is navigating within a scene of the video game,) versus other non-active gameplay aspects of the video game (e.g., while configuring game settings of the video game or while navigating a menu or when paused), when the interactive application is a video game. The lights 200 might also be configured to indicate relative intensity levels of gameplay. For example, the intensity of lights, or a rate of blinking may be configured to increase when the intensity of gameplay increases. In this manner, a person external to the user may view the lights on the HMD 102 and understand that the user is actively engaged in intense gameplay and may not wish to be disturbed at that moment. In other example, the lights can be configured to display distinct configurations when interacting with different interactive applications. The lights 200 are therefore used to indicate to the person of whether the user is currently engaged in interaction with content rendering on the HMD 102, the user's level of engagement with the content, and to the system about the location of the HMD 102 in the physical environment where the user wearing the HMD 102 is present.

The HMD 102 may additionally include one or more microphones. In the illustrated embodiment, the HMD 102 includes microphones 204A and 204B defined on the front surface of the HMD 102, and microphone 204C defined on a side surface of the HMD 102. By utilizing an array of microphones, sound from each of the microphones can be processed to determine the location of the sound's source. This information can be utilized in various ways, including exclusion of unwanted sound sources, association of a sound source with a visual identification, etc. The microphones 204A-204C are used to capture the external sounds occurring in the physical environment in which the user wearing the HMD 102 is present.

The HMD 102 may also include one or more image capture devices in addition to the image capture device (118 of FIG. 1). In the illustrated embodiment, the HMD 102 is shown to include image capture devices 202A and 202B disposed on the outside surface on the front face of the HMD 102. By utilizing a stereoscopic pair of image capture devices, three-dimensional (3D) images and video of the environment can be captured from the perspective of the HMD 102. Such video can be presented to the user to provide the user with a "video see-through" capability while wearing the HMD 102. In this implementation, the HMD 102 is not configured with a see-through capability. Consequently, even though the user cannot see through the HMD 102 in a strict sense, the video captured by the image capture devices 202A and 202B can nonetheless provide a functional equivalent of being able to see the environment external to the HMD 102 as if looking through the HMD 102. Such video can be augmented with virtual elements to provide an augmented reality experience. The augmentation may be done by overlaying the virtual elements over the objects in the video or may be combined or blended with the objects in the video in other ways. Though in the illustrated embodiment, two cameras are shown on the front surface of the HMD 102, it will be appreciated that there may be any number of externally facing cameras installed on the HMD 102, and oriented in different directions. For example, in another embodiment, there may be cameras mounted on the sides of the HMD 102 to provide additional panoramic image capture of the environment.

In another implementation, the HMD 102 may provide a see-through capability with the display screen of the HMD 102 being transparent for the user to view the physical environment of the real-world in the vicinity of the user. In this implementation, images of the virtual elements may be super-imposed over portions of the real-world objects. The HMD 102, in this alternate implementation is configured for augmented reality applications.

In the implementation illustrated in FIGS. 2A-1 and 2A-2, the barometric pressure sensors 212 are disposed in a single line on an inside surface of the HMD 102 just above the top surface of the lens 210 disposed in front of each eye. Of course, the location of the barometric pressure sensors just above the lens is provided as a mere example and other locations near the lens 210 may also be envisioned including on the inside surface of the frame 211 just below the bottom surface of the lens 210 or on the inside surface of the frame near the sides of the lens 210 or on the inside surface of the frame 211 around the lens 210. The locations within the HMD 102 where the barometric pressure sensors 212 are disposed are determined so as to be proximal to the facial feature that is being tracked. In the implementation illustrated in FIGS. 2A-1 and 2A-2, the barometric pressure sensors are disposed proximal to the eyes of the user to track the motions of the eyes using the pressure waves created by the motions. In some implementation, proximity is defined to be a separation distance between the facial feature (e.g., eyes) of the user and the pressure sensors that enables the pressure sensors to detect the movement. In one implementation, the separation distance may be defined by tuning the sensitivity of the pressure sensors.

In some implementations, the barometric pressure sensors may be defined using chip-based technology, such as Micro Electro-Mechanical Systems (MEMs). The MEMs, in some implementation, may be piezoresistive or capacitive MEMs. The implementations are not restricted to MEMs based sensors but can include other type of sensors so long as the barometric pressure sensors are capable of sensing and tracking motions or actions performed by one or more facial features of the user. The pressure sensors are disposed at a distance from the eyes or other facial features of the user so as to be able to track motions or actions performed by the corresponding facial feature. In some implementations, the distance of separation between the pressure sensors 212 and the facial features may be between about 0.5" and about 2". The pressure sensors are used to capture pressure variances caused by the motion or action of the one or more facial features, specific time points corresponding to the content such pressure variances occur, and amount of time the pressure variances last. The pressure sensors are coupled to the processor so that the pressure variance data can be communicated to the processor within the HMD 102 for further processing. The processor of the HMD 102 may process the pressure variance data within or may forward it to the computer that is local or remote from the HMD 102 for processing. The pressure variance data is processed to identify metrics of motion of the facial features captured by the pressure sensors. The metrics of motion may by itself or combined with data captured by other sensors be used to determine the user's interest in the content and for providing appropriate content.

FIG. 2B illustrates a simplified block diagram of an alternate implementation of a HMD 102' where the barometric pressure sensors 212 are disposed. In this implementation, the array of barometric pressure sensors 212 is disposed outside of the HMD 102 and on a surface of an adjustable handle 213 that is provided in the HMD 102'. The adjustable handle 213 is coupled to the HMD 102' so as to allow the adjustable handle 213 to pivot about a pivot point defined where the adjustable handle 213 is coupled to the side of the HMD 102'. The pivoting allows the adjustable handle 213 to be moved up and down in front of the HMD 102' so as to position the pressure sensors proximate to the nose or mouth of the user. For instance, the adjustable handle 213 may be moved to position 213a to allow the pressure sensors 212 to be proximate to the mouth of the user in order to track the motion of the mouth when the user is vocalizing or breathing while watching the content of the interactive application currently rendering at the HMD 102' or in response to action or event occurring in the physical environment where the user wearing the HMD 102' is present. Similarly, the adjustable handle 213 may be moved to position 213b to cause the pressure sensors to be proximate to the nose of the user so as to track the user's breathing. The pressure waves caused by the user's vocalizing or breathing may be used to identify metrics of the motion as it pertains to the motion of the nose or the mouth. The metrics of the motion of the one or more facial features that are being tracked may be used to compute engagement metrics of the user. The system may use the engagement metrics to determine appropriate action(s) to take to keep the user engaged and/or to keep the user safe when the user is engaged in watching the content of the interactive application. For instance, the system can determine whether to continue providing the same content or adjust the content or provide new content or trigger a response from the interactive application.

In an alternate implementation (not shown), instead of using an adjustable handle 213 to mount the pressure sensors 212 outside of the HMD 102, the pressure sensors 212 may be mounted to an outside surface of the HMD 102 itself. In this implementation, the pressure sensors may be mounted on the outside surface along a bottom side of the frame 211 so as to be proximal to the nose or the mouth of the user and directionally oriented toward the nose or the mouth. Irrespective of which surface the sensors are mounted on the HMD 102, the sensors are defined to be proximate to a facial feature whose motion is to be tracked. The separation distance between the array of barometric pressure sensors and the respective facial feature is defined so as to be able to detect and capture the motions or actions of the respective facial features. As previously mentioned, the pressure sensors may be disposed at a separation distance of between about 0.5" and about 2" from the facial feature. It should be noted that the separation distance has been provided as a mere example and should not be considered limiting. The separation distance is defined based on sensitivity of the pressure sensors in successfully detecting the pressure waves caused by motion of a facial feature of the user. As previously mentioned, the sensitivity of the pressure sensors may be tuned to capture the short lived pressure waves caused by the motion or action of the facial feature. The pressure variances are interpreted to identify motion metrics. The motion metrics from the pressure variances may be used in addition to or instead of other data in determining level of immersion of the user to the content presented at the HMD 102.

In addition to tracking facial features, the barometric pressure sensors may be disposed on a surface of an interactive device, such as a controller, used to provide input to the interactive application, in one implementation. In this implementation, the array of barometric pressure sensors may be disposed on an outside surface of an interactive surface of the controller so as to be able to detect and capture motion occurring when the user moves their hand or finger over the surface where the barometric pressure sensors are disposed. The pressure variances in the air around the hand of the user caused by the movement of the user's hand over but proximate to the barometric pressure sensors are captured by the barometric pressure sensors and used to define motion metrics. The motion metrics from the hand movement may be used as input to the interactive application or may trigger a response to or at the interactive application.

Figure 3:
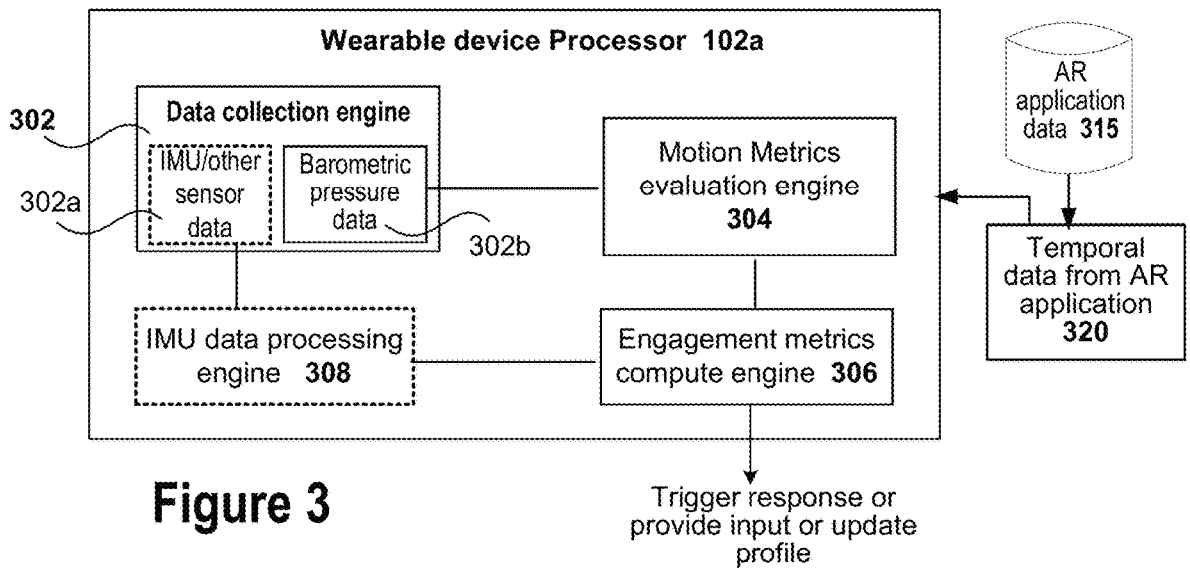
FIG. 3 illustrates a simplified block diagram of some of the components included in a processor associated with a wearable device on which the barometric pressure sensors are mounted to detect changes in pressure waves responsive to motion occurring proximate to the pressure sensors, in accordance with one implementation of the present disclosure.

FIG. 3 illustrates the various processing components (or modules or process engines) of a processor 102a within the wearable device, such as the HMD 102 equipped with the array of barometric pressure sensors, for capturing the pressure variances caused by motion of one or more facial features, in one implementation. The pressure variances are analyzed to determine the various metrics of motion. The HMD 102 includes memory, processor and network interface to communicate with a computer, a controller, an image capturing device, a router, etc. The memory is used to store the various applications or instructions of the various applications, data collected from the various components of the HMD 102, data collected from or for the various applications, user inputs, user profiles, content of an interactive application either executing on the processor or received from a computer/computing device connected to the HMD 102, etc. The aforementioned list is provided as an example and should not be considered exhaustive. The processor is used to retrieve the relevant data from memory and process the retrieved data, or execute application(s) to generate content for rendering, or receive data, content or signal from the computer/computing device, and forward the same to the display screen of the HMD 102 for rendering. Some of the processing components of the processor include data collection engine 302, motion metrics evaluation engine 304, and engagement metrics compute engine 306. In addition to the aforementioned processing components, the processor may also include an IMU data processing engine 308. The list of processing components is provided as an example and should not be considered exhaustive or limiting. Additional processing components may be included in the processor for processing other data (e.g., inputs from user, feedback from an application, etc.) and/or for generating signals to appropriate hardware or software components of the HMD 102 so as to allow the user to have an enjoyable and satisfying viewing experience. The signals to the various hardware/software components may be provided in response to inputs from the user wearing the HMD or in response to activity or event occurring in the physical environment, by an interactive application either executing at the HMD 102 or executing at a computing device communicatively coupled to the HMD 102.

The data collection engine 302 is configured to receive and process the pressure variances captured by the barometric pressure sensors and analyze the pressure variances to generate barometric pressure data 302b. The pressure variances occurring due to motion of facial features, for example, are short lived. The barometric pressure sensors are disposed proximate to the facial features and are sensitive enough to detect the pressure variances generated from the motion and/or action of the facial features. For example, the barometric pressure sensors located proximate to the eyes of the user capture pressure variances caused by the movement of the eyes of the user (e.g., motion caused by blinking or moving in a specific direction, etc.). The movement may be swift or slow, and may depend on the content being rendered or actions/event occurring in the content or in the physical environment in the vicinity of the user wearing the HMD 102. For example, the user's eyes may move slowly in one direction as the user follows a virtual object in the content (e.g., gameplay content) being presented. Alternately, the user's eyes may move swiftly in response to an event or a sudden movement occurring within the content or in the physical environment (e.g., fireworks in the right hand corner, a sudden appearance of a boss (in a video game) in the top left side, a sudden movement detected in the bottom center portion, a sudden movement or a loud noise occurring on one side of the physical environment in which the user wearing the HMD 102 is present, etc.). The slow motion of the eyes of the user may generate smaller pressure variances but may last for a longer time than the swift motion. Consequently, the barometric pressure sensors are selected to be sensitive enough to detect and measure the pressure variances generated by both the slow motion and swift motion of the eyes of the user as well as of other facial features. The pressure variances are analyzed to generate barometric pressure data 302b.

The pressure variances caused by motion of the facial features of the user and captured by the barometric pressure sensors are used to determine the user's interest in the content being rendered at the HMD 102 and the level of interest. The barometric pressure data 302b collected from the user may vary from one portion of the content to another based on the content that is being viewed by the user. Accordingly, the barometric pressure data 302b collected from the user during rendering of the different portions of the content are associated with the corresponding portions of the content using temporal data 320 provided by the interactive application, such as augmented reality (AR) application. The temporal data 320 is part of the AR application data stored in an AR application database 315 and made available to the data collection engine 302 so that the barometric pressure data 302b collected for different portions of the content can be properly associated with the corresponding portions using the temporal data 320. The motion related data (i.e., barometric pressure data 302b) collected by the barometric pressure sensors is forwarded to the motion metrics evaluation engine 304 as input for further analysis.

In some implementations, in addition to collecting pressure variances from the motion of the facial features, the data collection engine 302 may also be configured to collect and process data 302a from other sensors distributed on the HMD 102. The other sensors may include IMU sensors (e.g., magnetometers, gyroscopes, accelerometers), image sensors, global positioning system (GPS) sensors etc. Data 302a from the other sensors are used to determine location, direction, orientation, speed of movement, etc., of the HMD 102 worn by the user in the physical world and the barometric pressure sensors capture barometric pressure data 302b pertaining to motion of facial features of the user while the user is engaged in watching content provided on the display of the HMD 102. The barometric pressure data 302b provides additional data to, (a) fine tune the location, direction, orientation, speed of movement of the HMD 102, (b) derive engagement metrics of the user to the content, (c) provide inputs to different portions of the interactive application, (d) trigger a response from the interactive application for specific portions of the interactive application, and/or (e) define engagement metrics of the user, to name a few. The barometric pressure data 302b is provided as input to the motion metrics evaluation engine 304 for further processing.

The barometric pressure data 302b collected using the barometric pressure sensors may pertain to different portions of content and to different facial features depending on the location of the barometric pressure sensors. The motions of different facial features captured in the barometric pressure data 302b may be analyzed to identify different motion metrics. To begin with, the motion metrics evaluation engine 304 analyzes the barometric pressure data 302b to first identify the particular facial feature(s) to which specific ones of barometric pressure data 302b collected by the barometric pressure sensors correspond. Once the facial feature(s) are identified for the specific ones of the barometric pressure data 302b, the motion metrics evaluation engine 304 then analyzes the specific ones of the barometric pressure data 302b to identify motion metrics that corresponds with the identified facial feature(s). Some of the motions metrics that are identified by analyzing barometric pressure data 302b pertaining to different facial features will be discussed with reference to FIG. 4. The identified motion metrics are then forwarded to the engagement metrics compute engine 306 for further processing.

The engagement metrics compute engine 306 uses the input provided by the motion metrics evaluation engine 304 to determine the engagement metrics of the user to different portions of the content being presented. The engagement metrics for each portion of the content may include level of engagement (e.g., completely engaged, partially engaged, totally disengaged, or partially distracted), amount of time the user was engaged in the portion of the content, type of content being presented in the portion, intensity of the content in the portion, time points associated with user engagement in the portion, event(s) occurring in the portion, characters involved, and other pertinent information related to the consumption of the content. The engagement metrics determined by the engagement metrics compute engine 306 is used by the system to determine whether to continue to provide the content that is currently being rendered, or provide a different content (i.e., content from different interactive application), or provide additional content, or recommend to provide similar type of content during current or subsequent session in order to maintain or improve the engagement of the user. Additionally, the information provided by the engagement metrics compute engine 306 may be used to trigger a response from the interactive application, or provide inputs to the interactive application.

Figure 4:
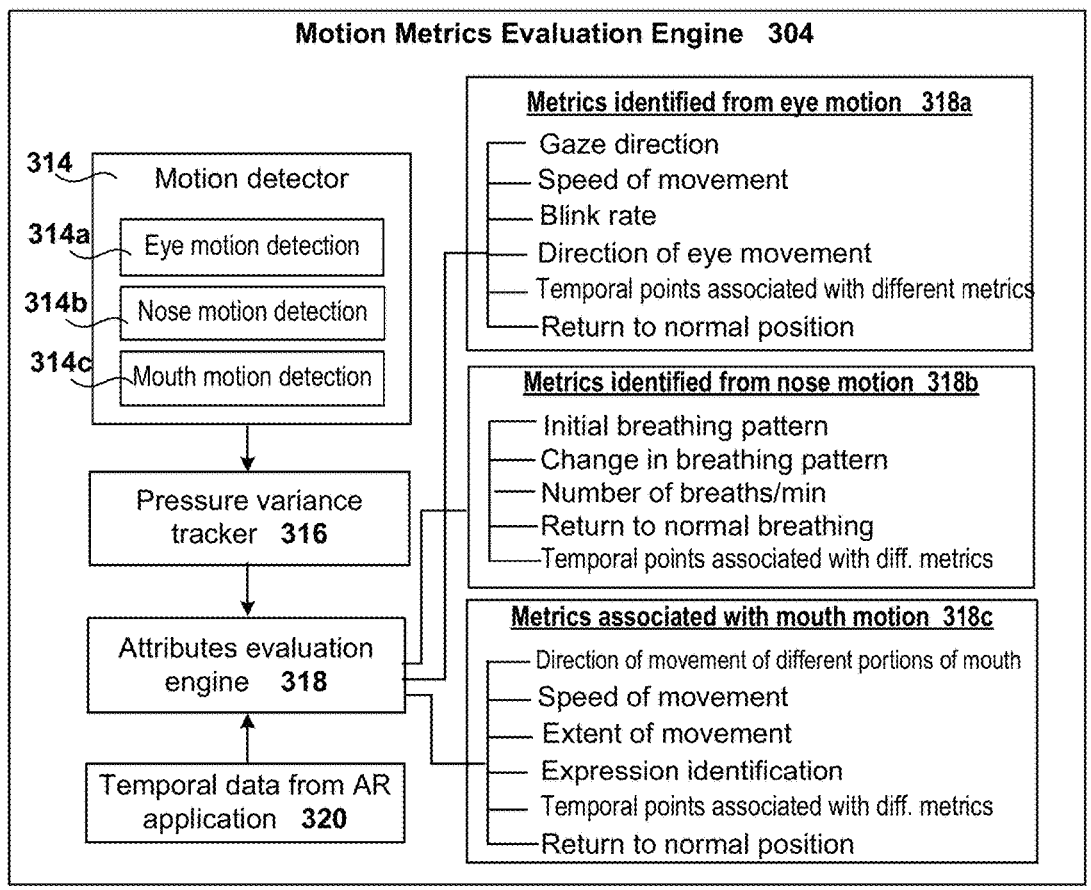
FIG. 4 illustrates a simplified block diagram of some of the components of a motion metrics evaluation engine that is used to evaluate the changes in the pressure waves caused due to the motion occurring proximate to the barometric pressure sensors, in accordance with one implementation of the present disclosure.

FIG. 4 illustrates some of the components of the motion metrics evaluation engine 304 that is used to identify the different motion metrics from the barometric pressure data 302b provided by the data collections engine 302, in one implementation. The motions metrics evaluation engine 304 includes a motion detector 314, a pressure variance tracker 316, and an attributes evaluation engine 318. The motion metrics evaluation engine 304 interacts with the interactive application (e.g., AR application) database 315 to obtain temporal data 320 pertaining to the AR application that is rendering content at the HMD 102 when the barometric pressure data 302b is being collected.

The motion detector 314 examines the barometric pressure data 302b to determine if the barometric pressure data 302b pertains to motion of specific one of the facial feature (i.e., pertains to eye motion 314a, or nose motion 314b, or mouth motion 314c) and to identify the facial feature. Once it is determined the particular facial feature is identified, the facial feature information is provided to the pressure variance tracker 316. The HMD 102 may be equipped with barometric pressure sensors to track and capture pressure variances caused by just the motion of the eyes, or the nose, or the mouth of the user, or the HMD 102 may be equipped with multiple arrays of barometric pressure sensors to track and capture motion of more than one facial feature (e.g., combination of motion of the eyes, nose and/or the mouth). The motion of tracking multiple facial features may be to verify that the motion metrics obtained from tracking motion of one facial feature is consistent with the motion metrics obtained from tracking motion of another facial feature. For example, the motion tracking of the eyes (e.g., rapid eye blinking or movement) may indicate that the user is involved in a high intensity portion of the interactive application, such as a video game. This can be verified by tracking the motion of the nose to determine if the breathing pattern of the user is consistent with such assertion. If the breathing pattern indicates that the user is breathing fast (indicating that the user is excited), then that may provide the confirmation that the user is indeed involved in the high intensity portion of the interactive application.

The information related to motion of specific facial features that generated the specific ones of the barometric pressure data 302b is provided to the pressure variance tracker 316. The pressure variance tracker 316 is configured to detect the pressure variances (i.e., changes in the pressure waves) occurring due to the motion of the specific facial feature that is being tracked. The pressure variances due to the motion of some of the facial features may be easy to track than others. For instance, the pressure variances caused by the breathing may be easily detectable than the pressure variances caused by the blinking of the eyes or movement of the eyes in different directions. Similarly the pressure variances caused by the motion of the mouth due to the user vocalizing may be more easily detectable than the pressure variances caused by the blinking of the eyes. The pressure variance tracker 316 takes into consideration the sensitivity scale associated with the tracking of the motions of the different facial features when tracking the pressure variances occurring due to motion of the respective facial features. The pressure variance tracker 316 forwards the pressure variance data collected from the motion of the different facial features as input to the attributes evaluation engine 318.

The attributes evaluation engine 318 uses the pressure variance data provided by the pressure variance tracker 316 and the facial features that caused the pressure variances and identifies the motion metrics that correspond with the facial feature. The pressure variance data and the corresponding motion metrics may change from one portion of the content to another and may be different from one facial feature to another.

For instance, some of the motion metrics (318a) that may be identified from the pressure variances caused by the motion of the eyes of the user may include gaze direction, normal blink rate, changes in normal blink rate, temporal point when the change in normal blink rate was detected, temporal point when the eyes returned to normal blink rate after the change, normal resting state, change in normal resting state due to movement, direction of movement, speed of movement, time points when the change in normal resting state began and ended, etc. Some of the motion metrics (318b) that may be identified from pressure variances caused by the motion of the nose (i.e., breathing) may include initial breathing pattern, change in breathing pattern, number of breaths/min, return to normal breathing, type of breathing, temporal points associated with the content when the breathing pattern changed from normal state and returned to normal state, etc. Some of the motion metrics (318c) that may be identified from pressure variances caused by the motion of the mouth may include normal resting state, change in normal resting state, direction of movement of different portions of mouth, speed of movement, temporal points associated with the beginning and end of change in normal resting state, etc. From the identified motion metrics additional metrics may be derived. For example, the additional metrics may include engagement metrics, such as level of engagement, amount of time the user was engaged in content, level of distraction, etc., while the user is watching different portions of the content, which can be used to determine the physiological state of the user at the corresponding portions. The identified motion metrics may also be interpreted to define inputs, trigger response from the interactive application, and to provide feedback to the interactive application.

For example, the breathing pattern of the user and the time period the user has followed such breathing pattern may be used to determine the physiological well being of the user (i.e., fatigue level, excitement level, likelihood of disorientation, normal level, etc.). In this example, the interactive application may be a fitness tracker application and the pressure sensors may be provided on the HMD 102 worn by the user as the user is performing exercise routine rendering on the display screen of the HMD 102. The breathing pattern may vary based on the intensity of the exercise that the user is performing. When the fatigue level is high, a response from the fitness tracker application to stop or pause the exercise routine may be triggered to allow the user to rest and avoid bodily harm. Similarly, the motion metrics related to the eyes of the user may be used to determine if the user is getting disoriented, or is getting distracted frequently. When it is determined that the user is getting disoriented, the interactive application may be directed to pause the content provided for rendering so the user can recover. The pressure variance data and the corresponding motion metrics are associated with the appropriate portion of the content using the temporal data 320 obtained from the AR application that is maintained in the AR application database 315 so as to correlate the user's interaction to the content that was rendering.

Figure 5A:
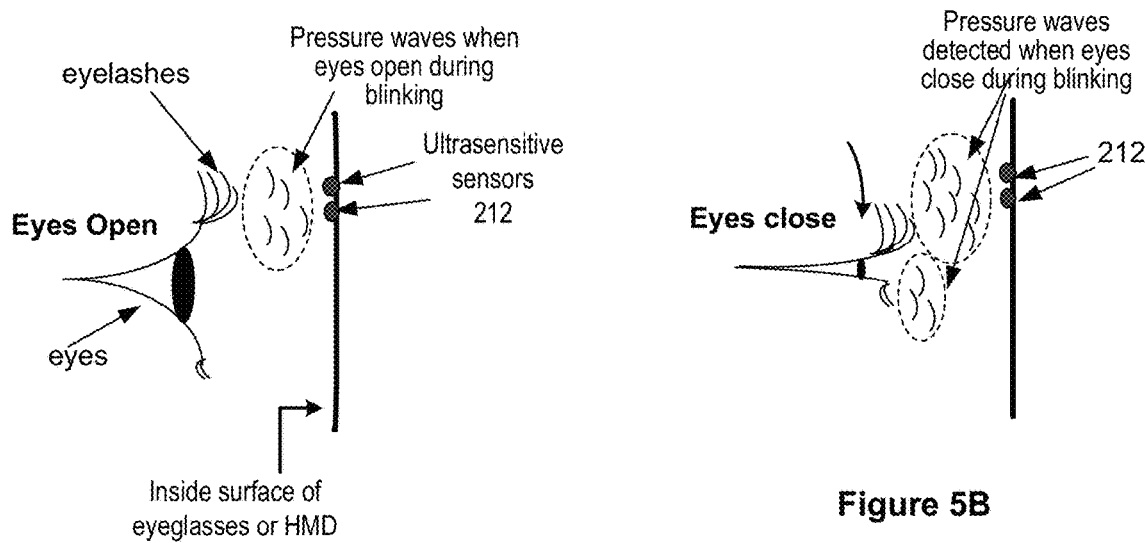
Figure 5A:
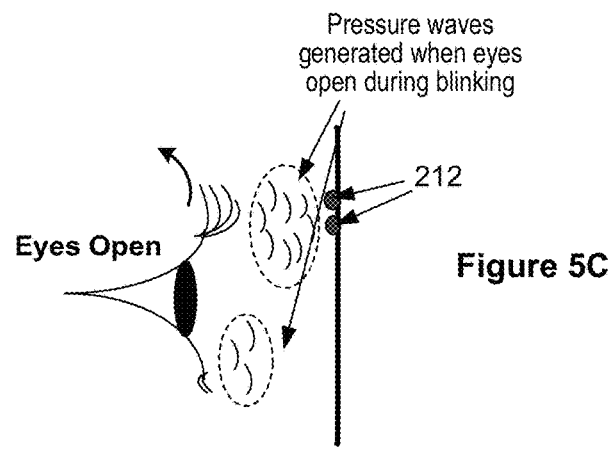

FIGS. 5A-5D illustrate an example implementation wherein the motion of the eyes of the user are tracked and used to determine the engagement metrics of the user to the content of the interactive application, such as the video game. FIGS. 5A-5D show only an eye and not the remaining portion of the face of the user so as to focus on the facial feature whose motion is being tracked. As shown in FIG. 5A, the user's eyes are open and the pressure waves caused by the eyelids of the user moving is tracked using the array of ultrasensitive pressure sensors that are disposed on the inside surface of a frame of the HMD (portion of the frame is shown) and directionally mounted to face of the eyes of the user. FIG. 5B illustrates the pressure waves generated due to the movement of the eyelids when the user closes the eyes when blinking. The pressure waves from the closing of the eyelids of the user are detected and captured by the array of motion sensors. FIG. 5C illustrates the pressure waves created when the eyelids of the user move to the open position when blinking. The variation in the pressure waves due to the blinking is captured and used to determine the engagement metrics of the user. In place of or in addition to tracking the eyelids of the user when blinking, the movement of the eyes in different direction may also be tracked using the pressure waves created by such movement.

Figure 5D:
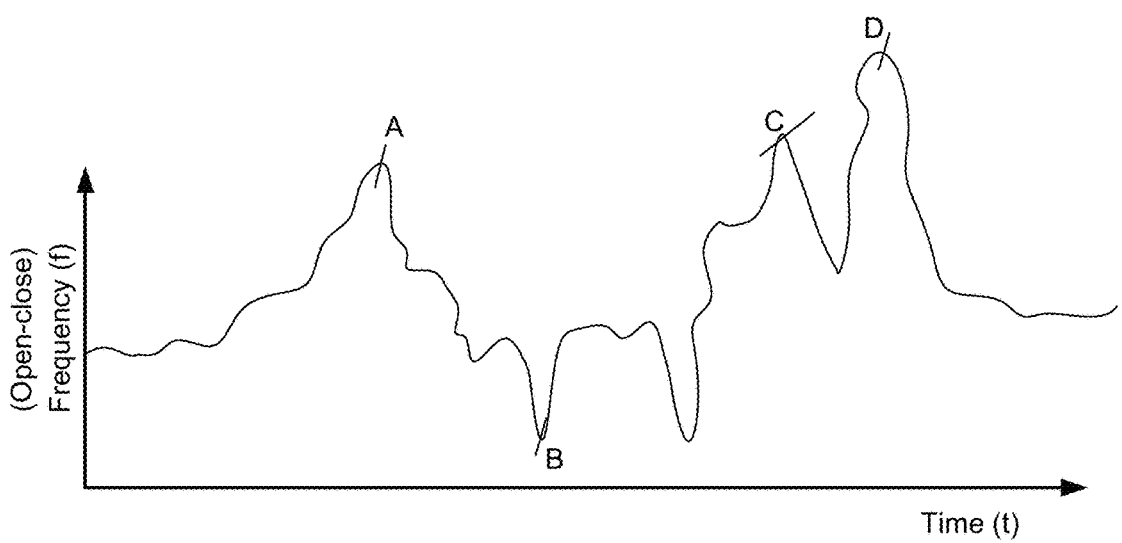
FIG. 5D illustrates a sample graph in which frequency of pressure waves detected from movement of the eyes of the user captured during blinking, for example, plotted against time used for determining motion metrics, in accordance to one implementation of the present disclosure.

FIG. 5D illustrates a graph that may be generated by the motion metrics evaluation engine 304 by plotting the frequency of the movement in different directions as a function of time. The variations in the graph provide a visual indication of the changes that were detected in the movement of eyes of the user, wherein the changes may correspond with different portions of the interactive application, for example. Similar graphs may be generated for the movement of the nose and/or mouth. Information from the graphs provides the engagement metrics of the user to the content of the interactive application. When the interactive application reaches a portion represented by point A, the barometric sensors may detect lot of blinking by the user. The increased amount of blinking may relate to events or activities occurring in the interactive application or may be due to events or actions occurring in the real world environment in which the user is present. Based on the amount of blinking detected from tracking the movement of the eyes of the user, it may be determined that the user may be getting disoriented or getting too excited. Responsive to such determination, the content provided to the user at the HMD may be slowed or paused, for example. The pausing or slowing of the content, in one implementation, may be enabled when the amount of movement in the eyes of the user reaches or exceeds a predefined threshold level (i.e., amount of blinking exceeds a certain threshold number). This may be done so as to not disrupt the user's engagement in the interactive application.

Similarly, the user's eyes may not move too much when content from a different portion of the interactive application is being rendered. Point B shows one such example when the frequency of blinking of the user is normal or slow. The slow blinking may correspond to a portion of content of the interactive application where not much activity or event is occurring. As a result, no change to the content may be recommended by the interactive application or the server. When the user continues to view and interact with the content of the interactive application, the blinking pattern of the user may change when approaching point C of the graph that corresponds to a different portion of the content that is different from points A, B. The system may observe the amount of time that the user is in the excited state and make a determination of slowing or pausing or stopping rendering of the content. It may be determined that the amount of time the user's blinking pattern remained at level C may have been short lived. Consequently, the system may not take any action of changing the rendering of the content. However, when the portion of the content rendered at the HMD approaches point D, the user's blinking pattern may be greater than the predefined threshold level. As a result, the system (either the interactive application or the server) may determine to pause, or slow down the rendering of the content, or change the content entirely. The decision to pause or slow down or replace the content may be made in order to keep the user safe and not let them get disoriented. In some implementations, a second graph may be plotted to indicate the engagement metrics of the user for different portions of the content and the temporal data may be used to correlate the engagement metrics to specific occurrences of events either in the content of the interactive application or in the physical world where the user is present and engaged in interacting with the interactive application.

Figure 6:
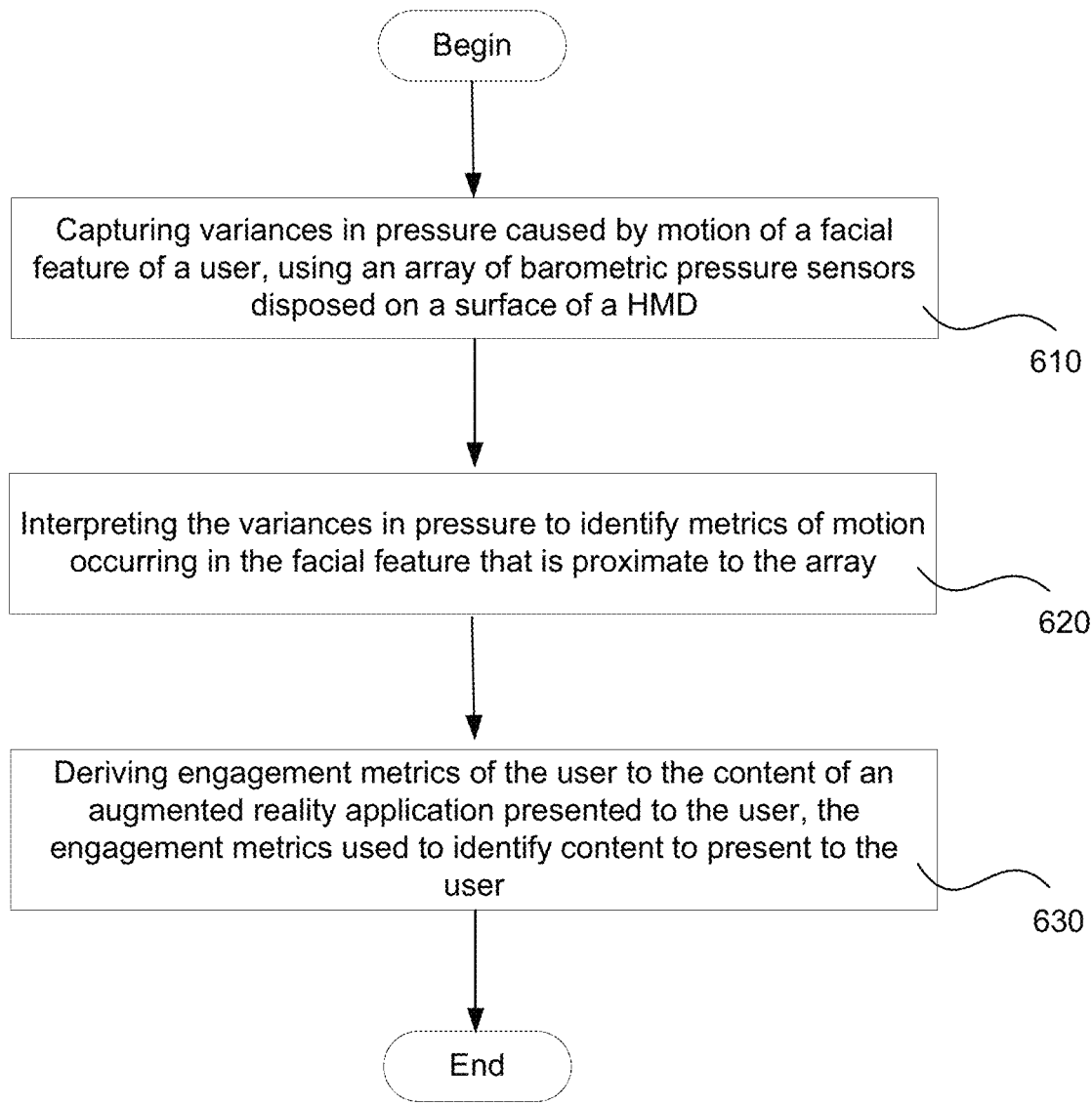
FIG. 6 illustrates flow operations of a method for interacting with an augmented reality application using data collected from barometric pressure sensors mounted on a wearable device used by the user, in one implementation of the present disclosure.

FIG. 6 illustrates various flow operations of a method for interacting with an augmented reality (AR) application using data collected from barometric pressure sensors mounted on a wearable device used by the user, in one implementation of the present disclosure. The method begins at operation 610, wherein variances in pressure caused by motion of a facial feature is detected and captured. The user may be interacting with content of the AR application rendered on a display of a head mounted display (HMD—i.e., the wearable device) worn by the user. The variances in pressure are captured using an array of barometric pressure sensors that are disposed on a surface of the HMD proximate to a facial feature that is being tracked. In one implementation, the facial feature that is tracked may be the eyes of the user and the array of barometric pressure sensors are disposed on an inside surface of a frame of a housing of the HMD proximate to the eyes of the user. In one implementation, the array of barometric pressure sensors are disposed just above the lens of the HMD and directionally oriented toward the eyes of the user so as to be able to capture the pressure variance occurring due to motion (e.g., blinking, moving in different directions) of the eyes of the user. In other implementations, the location and orientation of the barometric pressure sensors to track the motion of the eyes of the user may vary. In alternate implementation, the facial feature that may be tracked may be the nose to determine breathing attributes of the user, or the mouth to determine attributes related to the breathing and/or vocalizing (i.e., speaking or reacting) of the user as the user is interacting with the content of the AR application.

The variances in pressure are interpreted to identify metrics of the motion of the facial feature, as illustrated in operation 620. The metrics of the motion may vary based on the specific facial feature whose motion is being tracked. The various metrics that may be identified from the motion of the different facial features were discussed with reference to FIG. 4. The metrics identified in FIG. 4 are provided as a mere example and should not be considered restrictive. The metrics that are identified may be directly deduced by analyzing the pressure variances. Additional metrics may also be identified by analyzing the pressure variances detected by the barometric pressure sensors. Additional metrics may be derived using the metrics identified by analyzing the pressure variances.

The metrics and the additional metrics are used to derive engagement metrics of the user to the content of the AR application, as illustrated in operation 630. The engagement metrics may be determine for each portion of the content of the AR application and may include level of engagement of the user (e.g., completely engaged, partially engaged, totally disengaged, or partially distracted) in the different portions of the content, amount of time the user was engaged in the different portions of the content, type of content being presented in the portion, intensity of the content in the portion, time points associated with user engagement in the portion, and other pertinent information related to the consumption of the content, to name a few. The pressure variance data captured by the barometric pressure sensors provide additional way to gauge a user's interest in the content and can be used independently or fused with data from other sensors to determine if the content that is being presented needs to continue, or a different content or additional content needs to be provided, type of content and type of interactive application that captures the user's interest, etc. The engagement metrics defining the engagement level of the user may be updated to a user profile of the user maintained in the HMD or in the server that provides the content. The updated user profile may be used to recommend content and/or interactive applications for the user during subsequent sessions.

Figure 7:
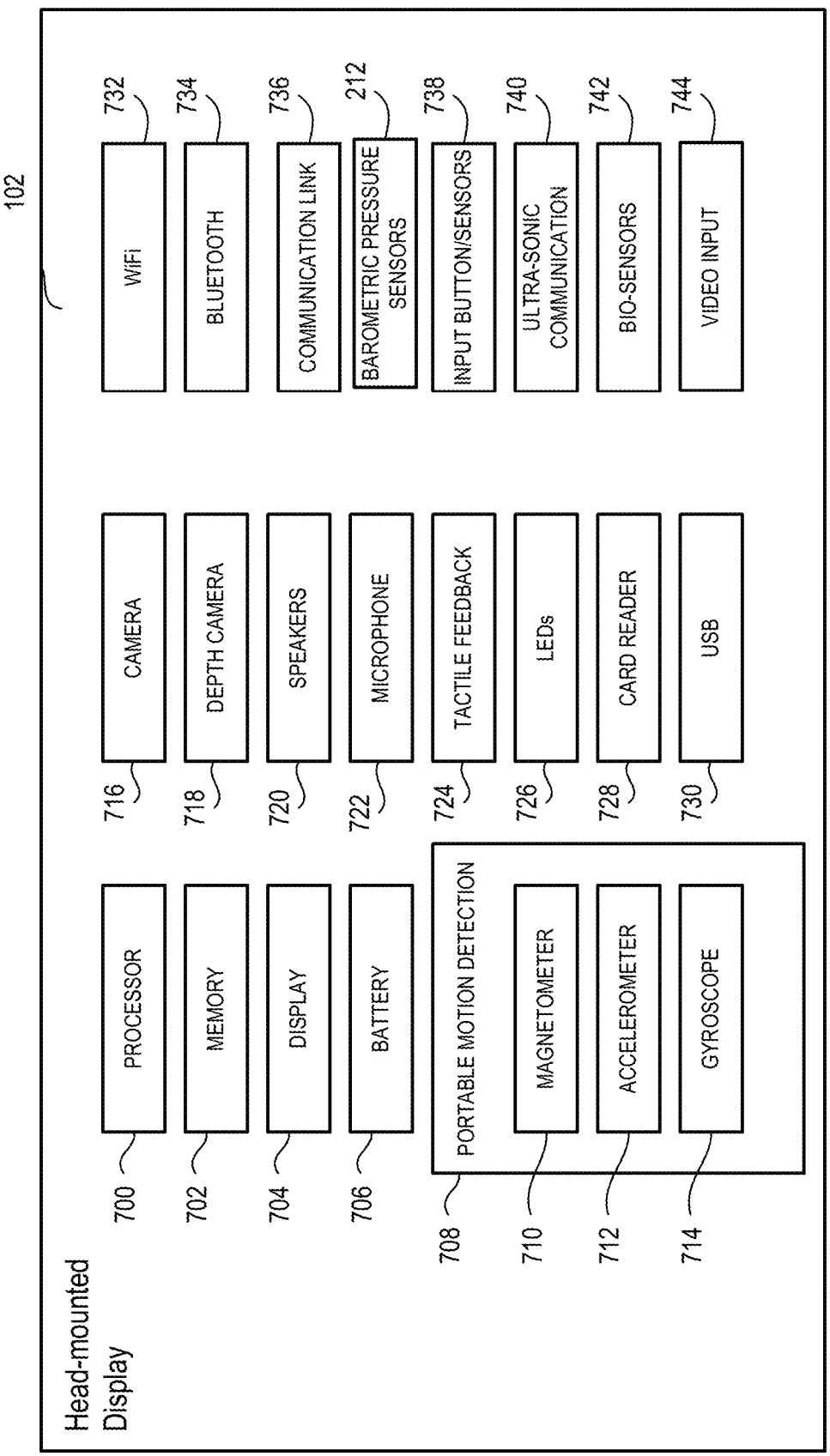
FIG. 7 illustrates the various components of a head mounted display (i.e., wearable device), in accordance with one implementation.

FIG. 7 illustrates various components of a head mounted display 102, in accordance with one implementation of the disclosure. The head mounted display 102 includes a processor 700 for executing program instructions. A memory 702 is provided for storage purposes, and may include both volatile and non-volatile memory. A display 704 is included which provides a visual interface that a user may use to view content. A battery 706 is provided as a power source for the head mounted display 102. A motion detection module 708 may include any of various kinds of motion sensitive hardware, such as a magnetometer 710, an accelerometer 712, and a gyroscope 714.

An accelerometer 712 is a device for measuring acceleration and gravity induced reaction forces. Single and multiple axis models are available to detect magnitude and direction of the acceleration in different directions. The accelerometer is used to sense inclination, vibration, and shock. In one embodiment, three accelerometers 712 are used to provide the direction of gravity, which gives an absolute reference for two angles (world-space pitch and world-space roll).

A magnetometer 710 measures the strength and direction of the magnetic field in the vicinity of the head mounted display. In one embodiment, three magnetometers 710 are used within the head mounted display, ensuring an absolute reference for the world-space yaw angle. In one embodiment, the magnetometer is designed to span the earth magnetic field, which is ±80 microtesla. Magnetometers are affected by metal, and provide a yaw measurement that is monotonic with actual yaw. The magnetic field may be warped due to metal in the environment, which causes a warp in the yaw measurement. If necessary, this warp can be calibrated using information from other sensors such as the gyroscope or the camera. In one embodiment, accelerometer 712 is used together with magnetometer 710 to obtain the inclination and azimuth of the head mounted display 102.

In some implementations, the magnetometers 710 of the head mounted display 102 are configured so as to be read during times when electromagnets in other nearby devices are inactive.

A gyroscope 714 is a device for measuring or maintaining orientation, based on the principles of angular momentum. In one embodiment, three gyroscopes 714 provide information about movement across the respective axis (x, y and z) based on inertial sensing. The gyroscopes help in detecting fast rotations. However, the gyroscopes can drift overtime without the existence of an absolute reference. This requires resetting the gyroscopes periodically, which can be done using other available information, such as positional/orientation determination based on visual tracking of an object, accelerometer, magnetometer, etc.

A camera 716 (similar to camera 118 of FIG. 1) is provided for capturing images and image streams of a real environment. More than one camera may be included in the head mounted display 102, including a camera that is rear-facing (directed away from a user when the user is viewing the display of the head mounted display 102), and a camera that is front-facing (directed towards the user when the user is viewing the display of the head mounted display 102). Additionally, a depth camera 718 may be included in the head mounted display 102 for sensing depth information of objects in a real environment.

The head mounted display 102 includes speakers 720 for providing audio output. Also, a microphone 722 may be included for capturing audio from the real environment, including sounds from the ambient environment, speech made by the user, etc. The head mounted display 102 includes tactile feedback module 724 for providing tactile feedback to the user. In one embodiment, the tactile feedback module 724 is capable of causing movement and/or vibration of the head mounted display 102 so as to provide tactile feedback to the user.

LEDs 726 are provided as visual indicators of statuses of the head mounted display 102. For example, an LED may indicate battery level, power on, etc. A card reader 728 is provided to enable the head mounted display 102 to read and write information to and from a memory card. A USB interface 730 is included as one example of an interface for enabling connection of peripheral devices, or connection to other devices, such as other portable devices, computers, etc. In various embodiments of the head mounted display 102, any of various kinds of interfaces may be included to enable greater connectivity of the head mounted display 102.

A WiFi module 732 is included for enabling connection to the Internet or a local area network via wireless networking technologies. Also, the head mounted display 102 includes a Bluetooth module 734 for enabling wireless connection to other devices. A communications link 736 may also be included for connection to other devices. In one embodiment, the communications link 736 utilizes infrared transmission for wireless communication. In other embodiments, the communications link 736 may utilize any of various wireless or wired transmission protocols for communication with other devices.

Barometric pressure sensors 212 are included to detect pressure waves caused by motion of certain ones of facial features that are being tracked. Pressure variance data is used to gauge engagement level of the user to the content, provide inputs to an interactive application providing content, adjust content provided to the user, or trigger response from the interactive application. Input buttons/sensors 738 are included to provide an input interface for the user. Any of various kinds of input interfaces may be included, such as buttons, touchpad, joystick, trackball, etc. An ultra-sonic communication module 740 may be included in head mounted display 102 for facilitating communication with other devices via ultra-sonic technologies.

Bio-sensors 742 are included to enable detection of physiological data from a user. In one embodiment, the bio-sensors 742 include one or more dry electrodes for detecting bio-electric signals of the user through the user's skin.

A video input 744 is configured to receive a video signal from a primary processing computer (e.g. main game console) for rendering on the HMD. In some implementations, the video input is an HDMI input.

The foregoing components of head mounted display 102 have been described as merely exemplary components that may be included in head mounted display 102. In various embodiments of the disclosure, the head mounted display 102 may or may not include some of the various aforementioned components. Embodiments of the head mounted display 102 may additionally include other components not presently described, but known in the art, for purposes of facilitating aspects of the present disclosure as herein described.

Figure 8:
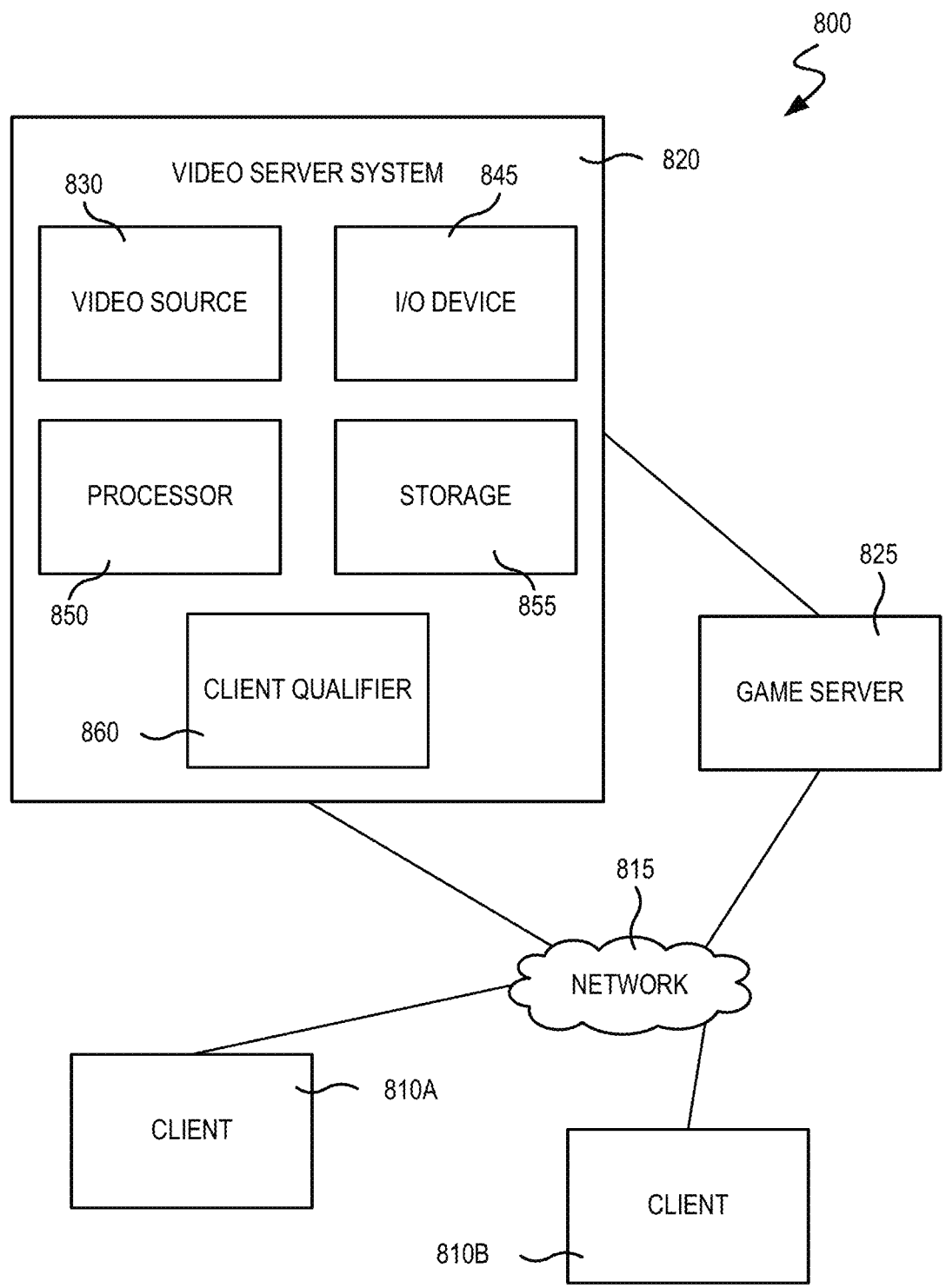
FIG. 8 illustrates a simplified block diagram of a game cloud server used for generating and accessing annotations for a video content stream generated by a producer, in accordance with one implementation of the present disclosure.

FIG. 8 is a block diagram of an example Game System 800 that may be used to provide content to the HMD for user consumption and interaction, according to various embodiments of the disclosure. Game System 800 is configured to provide a video stream to one or more Clients 810 via a Network 815, wherein one or more of the clients 810 may include HMD (102), eyeglasses, or other wearable devices. In one implementation, the Game System 800 is shown to be a cloud game system with an instance of the game being executed on a cloud server and the content streamed to the clients 810. In an alternate implementation, the Game System 800 may include a game console that executes an instance of the game and provides streaming content to the HMD for rendering. Game System 800 typically includes a Video Server System 820 and an optional game server 825. Video Server System 820 is configured to provide the video stream to the one or more Clients 810 with a minimal quality of service. For example, Video Server System 820 may receive a game command that changes the state of or a point of view within a video game, and provide Clients 810 with an updated video stream reflecting this change in state with minimal lag time. The Video Server System 820 may be configured to provide the video stream in a wide variety of alternative video formats, including formats yet to be defined. Further, the video stream may include video frames configured for presentation to a user at a wide variety of frame rates. Typical frame rates are 30 frames per second, 60 frames per second, and 120 frames per second. Although higher or lower frame rates are included in alternative embodiments of the disclosure.

Clients 810, referred to herein individually as 810A, 810B, etc., may include head mounted displays, terminals, personal computers, game consoles, tablet computers, telephones, set top boxes, kiosks, wireless devices, digital pads, stand-alone devices, handheld game playing devices, and/or the like. Typically, Clients 810 are configured to receive encoded video streams, decode the video streams, and present the resulting video to a user, e.g., a player of a game. The processes of receiving encoded video streams and/or decoding the video streams typically includes storing individual video frames in a receive buffer of the Client. The video streams may be presented to the user on a display integral to Client 810 or on a separate device such as a monitor or television. Clients 810 are optionally configured to support more than one game player. For example, a game console may be configured to support two, three, four or more simultaneous players. Each of these players may receive a separate video stream, or a single video stream may include regions of a frame generated specifically for each player, e.g., generated based on each player's point of view. Clients 810 are optionally geographically dispersed. The number of clients included in Game System 800 may vary widely from one or two to thousands, tens of thousands, or more. As used herein, the term "game player" is used to refer to a person that plays a game and the term "game playing device" is used to refer to a device used to play a game. In some embodiments, the game playing device may refer to a plurality of computing devices that cooperate to deliver a game experience to the user. For example, a game console and an HMD may cooperate with the video server system 820 to deliver a game viewed through the HMD. In one embodiment, the game console receives the video stream from the video server system 820, and the game console forwards the video stream, or updates to the video stream, to the HMD for rendering.

Clients 810 are configured to receive video streams via Network 815 (e.g., 110 of FIG. 1). Network 815 may be any type of communication network including, a telephone network, the Internet, wireless networks, powerline networks, local area networks, wide area networks, private networks, and/or the like. In typical embodiments, the video streams are communicated via standard protocols, such as TCP/IP or UDP/IP. Alternatively, the video streams are communicated via proprietary standards.

A typical example of Clients 810 is a personal computer comprising a processor, non-volatile memory, a display, decoding logic, network communication capabilities, and input devices. The decoding logic may include hardware, firmware, and/or software stored on a computer readable medium. Systems for decoding (and encoding) video streams are well known in the art and vary depending on the particular encoding scheme used.

Clients 810 may, but are not required to, further include systems configured for modifying received video. For example, a Client may be configured to perform further rendering, to overlay one video image on another video image, to crop a video image, and/or the like. For example, Clients 810 may be configured to receive various types of video frames, such as I-frames, P-frames and B-frames, and to process these frames into images for display to a user. In some embodiments, a member of Clients 810 is configured to perform further rendering, shading, conversion to 3-D, or like operations on the video stream. A member of Clients 810 is optionally configured to receive more than one audio or video stream. Input devices of Clients 810 may include, for example, a one-hand game controller, a two-hand game controller, a gesture recognition system, a gaze recognition system, a voice recognition system, a keyboard, a joystick, a pointing device, a force feedback device, a motion and/or location sensing device, a mouse, a touch screen, a neural interface, a camera, input devices yet to be developed, and/or the like.

The video stream (and optionally audio stream) received by Clients 810 is generated and provided by Video Server System 820. As is described further elsewhere herein, this video stream includes video frames (and the audio stream includes audio frames). The video frames are configured (e.g., they include pixel information in an appropriate data structure) to contribute meaningfully to the images displayed to the user. As used herein, the term "video frames" is used to refer to frames including predominantly information that is configured to contribute to, e.g. to effect, the images shown to the user. Most of the teachings herein with regard to "video frames" can also be applied to "audio frames."

Clients 810 are typically configured to receive inputs from a user. These inputs may include game commands configured to change the state of the video game or otherwise affect game play. The game commands can be received using input devices and/or may be automatically generated by computing instructions executing on Clients 810. The received game commands are communicated from Clients 810 via Network 815 to Video Server System 820 and/or Game Server 825. For example, in some embodiments, the game commands are communicated to Game Server 825 via Video Server System 820. In some embodiments, separate copies of the game commands are communicated from Clients 810 to Game Server 825 and Video Server System 820. The communication of game commands is optionally dependent on the identity of the command Game commands are optionally communicated from Client 810A through a different route or communication channel that that used to provide audio or video streams to Client 810A.

Game Server 825 is optionally operated by a different entity than Video Server System 820. For example, Game Server 825 may be operated by the publisher of a multi-player game. In this example, Video Server System 820 is optionally viewed as a client by Game Server 825 and optionally configured to appear from the point of view of Game Server 825 to be a prior art client executing a prior art game engine. Communication between Video Server System 820 and Game Server 825 optionally occurs via Network 815. As such, Game Server 825 can be a prior art multiplayer game server that sends game state information to multiple clients, one of which is game server system 820. Video Server System 820 may be configured to communicate with multiple instances of Game Server 825 at the same time. For example, Video Server System 820 can be configured to provide a plurality of different video games to different users. Each of these different video games may be supported by a different Game Server 825 and/or published by different entities. In some embodiments, several geographically distributed instances of Video Server System 820 are configured to provide game video to a plurality of different users. Each of these instances of Video Server System 820 may be in communication with the same instance of Game Server 825. Communication between Video Server System 820 and one or more Game Server 825 optionally occurs via a dedicated communication channel For example, Video Server System 820 may be connected to Game Server 825 via a high bandwidth channel that is dedicated to communication between these two systems.

Video Server System 820 comprises at least a Video Source 830, an I/O Device 845, a Processor 850, and non-transitory Storage 855. Video Server System 820 may include one computing device or be distributed among a plurality of computing devices. These computing devices are optionally connected via a communications system such as a local area network.

Video Source 830 is configured to provide a video stream, e.g., streaming video or a series of video frames that form a moving picture. In some embodiments, Video Source 830 includes a video game engine and rendering logic. The video game engine is configured to receive game commands from a player and to maintain a copy of the state of the video game based on the received commands This game state includes the position of objects in a game environment, as well as typically a point of view. The game state may also include properties, images, colors and/or textures of objects. The game state is typically maintained based on game rules, as well as game commands such as move, turn, attack, set focus to, interact, use, and/or the like. Part of the game engine is optionally disposed within Game Server 825. Game Server 825 may maintain a copy of the state of the game based on game commands received from multiple players using geographically disperse clients. In these cases, the game state is provided by Game Server 825 to Video Source 830, wherein a copy of the game state is stored and rendering is performed. Game Server 825 may receive game commands directly from Clients 810 via Network 815, and/or may receive game commands via Video Server System 820.

Video Source 830 typically includes rendering logic, e.g., hardware, firmware, and/or software stored on a computer readable medium such as Storage 855. This rendering logic is configured to create video frames of the video stream based on the game state. All or part of the rendering logic is optionally disposed within a graphics processing unit (GPU). Rendering logic typically includes processing stages configured for determining the three-dimensional spatial relationships between objects and/or for applying appropriate textures, etc., based on the game state and viewpoint. The rendering logic produces raw video that is then usually encoded prior to communication to Clients 810. For example, the raw video may be encoded according to an Adobe Flash® standard, .wav, H.264, H.263, On2, VP6, VC-1, WMA, Huffyuv, Lagarith, MPG-x. Xvid. FFmpeg, x264, VP6-8, realvideo, mp3, or the like. The encoding process produces a video stream that is optionally packaged for delivery to a decoder on a remote device. The video stream is characterized by a frame size and a frame rate. Typical frame sizes include 800×600, 1280×720 (e.g., 720p), 1024×768, although any other frame sizes may be used. The frame rate is the number of video frames per second. A video stream may include different types of video frames. For example, the H.264 standard includes a "P" frame and a "I" frame. I-frames include information to refresh all macro blocks/pixels on a display device, while P-frames include information to refresh a subset thereof. P-frames are typically smaller in data size than are I-frames. As used herein the term "frame size" is meant to refer to a number of pixels within a frame. The term "frame data size" is used to refer to a number of bytes required to store the frame.

In alternative embodiments Video Source 830 includes a video recording device such as a camera. This camera may be used to generate delayed or live video that can be included in the video stream of a computer game. The resulting video stream, optionally includes both rendered images and images recorded using a still or video camera. Video Source 830 may also include storage devices configured to store previously recorded video to be included in a video stream. Video Source 830 may also include motion or positioning sensing devices configured to detect motion or position of an object, e.g., person, and logic configured to determine a game state or produce video-based on the detected motion and/or position.

Video Source 830 is optionally configured to provide overlays configured to be placed on other video. For example, these overlays may include a command interface, log in instructions, messages to a game player, images of other game players, video feeds of other game players (e.g., webcam video). In embodiments of Client 810A including a touch screen interface or a gaze detection interface, the overlay may include a virtual keyboard, joystick, touch pad, and/or the like. In one example of an overlay a player's voice is overlaid on an audio stream. Video Source 830 optionally further includes one or more audio sources.

In embodiments wherein Video Server System 820 is configured to maintain the game state based on input from more than one player, each player may have a different point of view comprising a position and direction of view. Video Source 830 is optionally configured to provide a separate video stream for each player based on their point of view. Further, Video Source 830 may be configured to provide a different frame size, frame data size, and/or encoding to each of Client 810. Video Source 830 is optionally configured to provide 3-D video.

I/O Device 845 is configured for Video Server System 820 to send and/or receive information such as video, commands, requests for information, a game state, gaze information, device motion, device location, user motion, client identities, player identities, game commands, security information, audio, and/or the like. I/O Device 845 typically includes communication hardware such as a network card or modem. I/O Device 845 is configured to communicate with Game Server 825, Network 815, and/or Clients 810.

Processor 850 is configured to execute logic, e.g. software, included within the various components of Video Server System 820 discussed herein. For example, Processor 850 may be programmed with software instructions in order to perform the functions of Video Source 830, Game Server 825, and/or a Client Qualifier 860. Video Server System 820 optionally includes more than one instance of Processor 850. Processor 850 may also be programmed with software instructions in order to execute commands received by Video Server System 820, or to coordinate the operation of the various elements of Game System 800 discussed herein. Processor 850 may include one or more hardware device. Processor 850 is an electronic processor.

Storage 855 includes non-transitory analog and/or digital storage devices. For example, Storage 855 may include an analog storage device configured to store video frames. Storage 855 may include a computer readable digital storage, e.g. a hard drive, an optical drive, or solid state storage. Storage 815 is configured (e.g. by way of an appropriate data structure or file system) to store video frames, artificial frames, a video stream including both video frames and artificial frames, audio frame, an audio stream, and/or the like. Storage 855 is optionally distributed among a plurality of devices. In some embodiments, Storage 855 is configured to store the software components of Video Source 830 discussed elsewhere herein. These components may be stored in a format ready to be provisioned when needed.

Video Server System 820 optionally further comprises Client Qualifier 860. Client Qualifier 860 is configured for remotely determining the capabilities of a client, such as Clients 810A or 810B. These capabilities can include both the capabilities of Client 810A itself as well as the capabilities of one or more communication channels between Client 810A and Video Server System 820. For example, Client Qualifier 860 may be configured to test a communication channel through Network 815.

Client Qualifier 860 can determine (e.g., discover) the capabilities of Client 810A manually or automatically. Manual determination includes communicating with a user of Client 810A and asking the user to provide capabilities. For example, in some embodiments, Client Qualifier 860 is configured to display images, text, and/or the like within a browser of Client 810A. In one embodiment, Client 810A is an HMD that includes a browser. In another embodiment, client 810A is a game console having a browser, which may be displayed on the HMD. The displayed objects request that the user enter information such as operating system, processor, video decoder type, type of network connection, display resolution, etc. of Client 810A. The information entered by the user is communicated back to Client Qualifier 860.

Automatic determination may occur, for example, by execution of an agent on Client 810A and/or by sending test video to Client 810A. The agent may comprise computing instructions, such as java script, embedded in a web page or installed as an add-on. The agent is optionally provided by Client Qualifier 860. In various embodiments, the agent can find out processing power of Client 810A, decoding and display capabilities of Client 810A, lag time reliability and bandwidth of communication channels between Client 810A and Video Server System 820, a display type of Client 810A, firewalls present on Client 810A, hardware of Client 810A, software executing on Client 810A, registry entries within Client 810A, and/or the like.

Client Qualifier 860 includes hardware, firmware, and/or software stored on a computer readable medium. Client Qualifier 860 is optionally disposed on a computing device separate from one or more other elements of Video Server System 820. For example, in some embodiments, Client Qualifier 860 is configured to determine the characteristics of communication channels between Clients 810 and more than one instance of Video Server System 820. In these embodiments the information discovered by Client Qualifier can be used to determine which instance of Video Server System 820 is best suited for delivery of streaming video to one of Clients 810.

It should be understood that the various embodiments defined herein may be combined or assembled into specific implementations using the various features disclosed herein. Thus, the examples provided are just some possible examples, without limitation to the various implementations that are possible by combining the various elements to define many more implementations. In some examples, some implementations may include fewer elements, without departing from the spirit of the disclosed or equivalent implementations.

Embodiments of the present disclosure may be practiced with various computer system configurations including hand-held devices, microprocessor systems, microprocessor-based or programmable consumer electronics, minicomputers, mainframe computers and the like. Embodiments of the present disclosure can also be practiced in distributed computing environments where tasks are performed by remote processing devices that are linked through a wire-based or wireless network.

In some embodiments, communication may be facilitated using wireless technologies. Such technologies may include, for example, 5G wireless communication technologies. 5G is the fifth generation of cellular network technology. 5G networks are digital cellular networks, in which the service area covered by providers is divided into small geographical areas called cells. Analog signals representing sounds and images are digitized in the telephone, converted by an analog to digital converter and transmitted as a stream of bits. All the 5G wireless devices in a cell communicate by radio waves with a local antenna array and low power automated transceiver (transmitter and receiver) in the cell, over frequency channels assigned by the transceiver from a pool of frequencies that are reused in other cells. The local antennas are connected with the telephone network and the Internet by a high bandwidth optical fiber or wireless backhaul connection. As in other cell networks, a mobile device crossing from one cell to another is automatically transferred to the new cell. It should be understood that 5G networks are just an example type of communication network, and embodiments of the disclosure may utilize earlier generation wireless or wired communication, as well as later generation wired or wireless technologies that come after 5G.

With the above embodiments in mind, it should be understood that the disclosure can employ various computer-implemented operations involving data stored in computer systems. These operations are those requiring physical manipulation of physical quantities. Any of the operations described herein that form part of the disclosure are useful machine operations. The disclosure also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the method operations were described in a specific order, it should be understood that other housekeeping operations may be performed in between operations, or operations may be adjusted so that they occur at slightly different times or may be distributed in a system which allows the occurrence of the processing operations at various intervals associated with the processing, as long as the processing of the telemetry and game state data for generating modified game states are performed in the desired way.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

It should be understood that the various embodiments defined herein may be combined or assembled into specific implementations using the various features disclosed herein. Thus, the examples provided are just some possible examples, without limitation to the various implementations that are possible by combining the various elements to define many more implementations. In some examples, some implementations may include fewer elements, without departing from the spirit of the disclosed or equivalent implementations.

The invention claimed is:

1. A device for interacting with an interactive application, comprising:
   a housing;
   an array of barometric pressure sensors disposed on a surface of the housing, the array of barometric pressure sensors is defined on the surface so as to be proximal to and directed toward a facial feature of the user and configured to detect variances in pressure caused by a motion occurring in the facial feature proximate to the array; and
   a processor to interpret the variances in the pressure detected by the array to determine metrics of the motion occurring proximate to the array and to derive engagement metrics of the user to the content of the interactive application presented to the user.

2. The device of claim 1, wherein the device is a pair of glasses and the housing is a frame of the pair of glasses,
   wherein the surface of the housing on which the array of barometric pressure sensors is disposed is an inside surface of the frame, and
   wherein the array of barometric pressure sensors includes ultra-sensitive pressure sensors configured to detect pressure waves created from any movement in the facial feature of the user proximal to the array of barometric pressure sensors and is defined on the inside surface along a top portion of the frame of the device, the barometric pressure sensors are directionally mounted to face eyes of the user.

3. The device of claim 2, wherein the array of barometric pressure sensors are directionally mounted such that the barometric pressure sensors of the array are separated from eyes of the user by a distance, wherein the distance and the directional mount on the inner side along the top portion of the frame are defined to detect pressure waves generated from motions of the eyes of the user, and
   wherein the processor is configured to interpret the pressure waves to determine the metrics of the motions.

4. The device of claim 2, wherein the barometric pressure sensors of the array are arranged in a single line along the top portion on the inner side of the frame of the device.

5. The device of claim 1, wherein the metrics of motion of the facial feature determined from the variances in the pressure detected by the array include one or more of a rate of blinking, blinking pattern, speed of movement, direction of movement, specific time points when the motion occurred, content being presented at the specific time points, and time point when the facial feature of the user returned to normal restful state.

6. The device of claim 1, wherein the housing is a frame of the device, the housing includes a display screen for rendering the content of the interactive application,
wherein the surface of the housing on which the array of barometric pressure sensors is disposed is an outside surface of the frame, and
wherein the array of barometric pressure sensors are disposed on the outside surface along a bottom portion of the frame of the device, the barometric pressure sensors are directionally mounted to look up to the facial feature of the user that is being tracked.

7. The device of claim 6, wherein the facial feature is a nose of the user and the array of barometric pressure sensors include ultrasensitive pressure sensors and are directionally mounted on the outside surface along the bottom portion of the frame such that the barometric pressure sensors of the array are separated from the nose of the user by a second distance, wherein the second distance and the directional mount are defined to detect pressure waves generated from the user breathing, and
wherein the processor is configured to interpret the pressure waves to determine the metrics related to breathing of the user, wherein the interactive application is a fitness tracker application and the device is a wearable fitness tracker.

8. The device of claim 6, wherein the facial feature is a mouth of the user and the array of barometric pressure sensors include ultrasensitive pressure sensors and are directionally mounted on the outside surface along the bottom portion of the frame so as to face toward the mouth of the user, such that the barometric pressure sensors of the array are separated from the mouth of the user by a third distance, the third distance and the directional mount defined to detect pressure waves generated by the mouth when the user is vocalizing, and the processor is configured to interpret the pressure waves to determine metrics related to the vocalizing, the metrics used to provide an input to the interactive application to adjust content.

9. The device of claim 1, wherein the device is a head mounted display worn by the user and includes a display screen for rendering content of the interactive application.

10. The device of claim 1, wherein the device is a controller used to interact with the content of the interactive application rendered on a display screen associated with the device, and
wherein the array of barometric pressure sensors is directionally mounted to an outside surface of a body of the controller and configured to detect variances in pressure from the motion occurring proximate to the array, the motion interpreted to provide input to the interactive application.

11. The device of claim 1, wherein the device is communicatively coupled to a local console or to a cloud server executing the interactive application and providing the content of the interactive application for rendering on a display screen associated with the device.

12. The device of claim 1, wherein the device includes additional sensors to capture movement, orientation, direction, and speed of movement of the device, wherein the metrics of motion of the user captured by the array of barometric pressure sensors are fused with information of motion of the device captured by the additional sensors and used to determine engagement metrics of the user to content of the interactive environment.

13. The device of claim 1, wherein the barometric pressure sensors of the array are Micro Electro Mechanical system (MEMs) pressure sensors.

14. The device of claim 1, wherein the processor is further configured to interpret the metrics of motion generated during rendering of different portions of the content of the interactive application and to derive and associate engagement metrics of the user to each corresponding portion of the different portions of the content of the interactive application.

15. The device of claim 1, wherein the processor is further configured to trigger a response from the interactive application for specific one or more of different portions based on the engagement metrics of the user derived for said different portions.

16. The device of claim 1, wherein the processor is further configured to provide an input to a portion of the interactive application based on the metrics of motion determined for the portion.

17. The device of claim 1, wherein the interactive application is an augmented reality application.

18. A method for interacting with an augmented reality application, comprising:
capturing variances in pressure caused by motion of a facial feature of a user wearing a head mounted display (HMD) rendering content of the augmented reality application for the user to view, the variances in pressure captured by an array of barometric pressure sensors disposed on a surface of the HMD so as to be proximal to and directed toward the facial feature of the user;
interpreting the variances in pressure to identify metrics of motion occurring in the facial feature that is proximate to the array; and
deriving engagement metrics of the user to the content of the augmented reality application presented to the user.

19. The method of claim 18, wherein when the facial feature is eyes of the user, the variances in pressure captured correspond with the user blinking or moving the eyes in different directions;
wherein when the facial feature is nose of the user, the variances in pressure captured correspond to the user breathing the variances in pressure interpreted to identify breathing pattern of the user; and
wherein when the facial feature is mouth of the user, the variances in pressure captured correspond to the user breathing or vocalizing, the variances in pressure interpreted to identify breathing pattern of the user.

* * * * *